(12) United States Patent
Murakata et al.

(10) Patent No.: US 8,576,564 B2
(45) Date of Patent: Nov. 5, 2013

(54) ELECTRONIC APPARATUS

(75) Inventors: Masato Murakata, Hyogo (JP); Jun Sato, Osaka (JP); Kenichi Shindo, Osaka (JP)

(73) Assignee: Panasonic Corporation, Osaka (JP)

( * ) Notice: Subject to any disclaimer, the term of this patent is extended or adjusted under 35 U.S.C. 154(b) by 177 days.

(21) Appl. No.: 13/222,621

(22) Filed: Aug. 31, 2011

(65) Prior Publication Data

US 2012/0050970 A1  Mar. 1, 2012

(30) Foreign Application Priority Data

Aug. 31, 2010 (JP) .................................. 2010-194243
Aug. 31, 2010 (JP) .................................. 2010-194245

(51) Int. Cl.
  *G06F 1/16* (2006.01)
(52) U.S. Cl.
  USPC .................................................... 361/679.59
(58) Field of Classification Search
  USPC .................................................... 361/679.59
  See application file for complete search history.

(56) References Cited

U.S. PATENT DOCUMENTS

| | | | | |
|---|---|---|---|---|
| 5,235,495 A * | 8/1993 | Blair et al. | ............... | 361/679.26 |
| 5,375,076 A * | 12/1994 | Goodrich et al. | ........ | 361/679.17 |
| 6,016,248 A * | 1/2000 | Anzai et al. | ............... | 361/679.59 |
| 7,660,113 B2 * | 2/2010 | Kaneko | ................... | 361/679.59 |
| 7,916,478 B2 * | 3/2011 | Tu et al. | ................... | 361/679.59 |
| 8,045,323 B2 * | 10/2011 | Murakata | ................ | 361/679.01 |
| 8,243,444 B2 * | 8/2012 | Kawada et al. | .......... | 361/679.59 |
| 8,400,767 B2 * | 3/2013 | Yeom et al. | ............. | 361/679.59 |
| 8,405,981 B2 * | 3/2013 | Takemasa et al. | ........ | 361/679.59 |
| 2006/0050471 A1 * | 3/2006 | Chen | ............................ | 361/681 |
| 2006/0050472 A1 * | 3/2006 | Chen | ............................ | 361/681 |
| 2006/0077623 A1 * | 4/2006 | Yeh | ............................... | 361/681 |
| 2007/0076362 A1 * | 4/2007 | Lagnado | ...................... | 361/683 |
| 2007/0238340 A1 | 10/2007 | Ohira et al. | | |

FOREIGN PATENT DOCUMENTS

| JP | 11-259171 | 9/1999 |
|---|---|---|
| JP | 2007-048326 | 2/2007 |
| JP | 2007-281258 | 10/2007 |
| JP | 2008-176599 | 7/2008 |

\* cited by examiner

*Primary Examiner* — Lisa Lea Edmonds
(74) *Attorney, Agent, or Firm* — Hamre, Schumann, Mueller & Larson, P.C.

(57) ABSTRACT

Operability of an electronic apparatus while grasping it in the hand is improved, and display panel visibility is improved. The electronic apparatus includes a main body part, a display device, and a handle portion. The handle portion includes first and second leg portions having first ends connected to the main body part, and a grip portion to which second ends of the leg portions are connected. The handle portion has a shape such that the grip portion is positioned on the back surface side relative to the main body part thickness direction center-line that is at an equal distance from the front surface and the back surface.

3 Claims, 17 Drawing Sheets

ELECTRONIC APPARATUS

BACKGROUND OF THE INVENTION

1. Field of the Invention

The present application relates to an electronic apparatus.

2. Description of Related Art

Recently, portable electronic apparatuses provided with a display panel having a touch panel function for inputting information, such as mobile computers, personal digital assistants (PDAs), portable game machines, and cell phones, have been widely used. Among such devices, electronic apparatuses called tablet personal computers (hereinafter referred to as tablet PCs), for which information is basically input from a touch panel without using a keyboard or a switch button so that the overall size can be small and information can be displayed in a larger area, have started to become rapidly popular because their novel low-profile box-like case design and their various forms of use are favored.

Japanese Laid-Open Patent Publication No. 2007-048326 (Patent Document 1) discloses a tablet PC. Japanese Laid-Open Patent Publication No. 2007-281258 (Patent Document 2) discloses a portable device provided with a handle-like frame 2E. The frame 2E disclosed in Patent Document 2 is provided so as to protrude in a longitudinal direction of the case (disclosed in paragraph 0100 and FIGS. 33 to 35 of the specification of Patent Document 2).

The tablet PC disclosed in Patent Document 1 is not provided with a handle portion that a user can grasp. Therefore, when a user operates the tablet PC while holding it with the hand, the user grasps a side portion of the case or places the tablet PC on the palm. In either way, the tablet PC when operated is not in a stable position, and thus operability deteriorates.

Even if a handle that corresponds to the frame 2E disclosed in Patent Document 2 is applied to the tablet PC disclosed in Patent Document 1, operability deteriorates. That is, since the frame 2E disclosed in Patent Document 2 is provided so as to protrude in a longitudinal direction of the case, grasping the frame 2E while applying the arm to the back surface 2C of the case makes the wrist bend at a sharp angle, thus causing the user to feel intense fatigue in the arm and the operability to deteriorate.

SUMMARY OF THE INVENTION

The first electronic apparatus disclosed in the present application includes a main body part provided with a display portion on a front surface side, and a handle portion having a pair of leg portions with first ends being connected to the main body part, and a grip portion connected to second ends of the leg portions, so as to allow the main body part to be held, the handle portion having a shape such that the grip portion is positioned on a back surface side relative to a main body part thickness direction centerline that is at an equal distance from a front surface and a back surface that is on a side opposite the front surface.

The second electronic apparatus disclosed in the present application includes a main body part having a front surface provided with a display portion and a back surface that is on a side opposite the front surface, and a handle portion having a pair of leg portions with first ends being connected to the main body part, a pair of bent portions with first ends being respectively fixed to second ends of the leg portions, and a grip portion with end portions to which second ends of the bent portions are respectively fixed, so as to allow the main body part to be held, outer edges of the bent portions being defined by curves each having a specific curvature and a specific length.

According to the disclosure of the present application, an electronic apparatus can be grasped so as to attain a stable position, and fatigue of the arm grasping the electronic apparatus can be lessened.

DETAILED DESCRIPTION OF THE INVENTION

Figure 1:
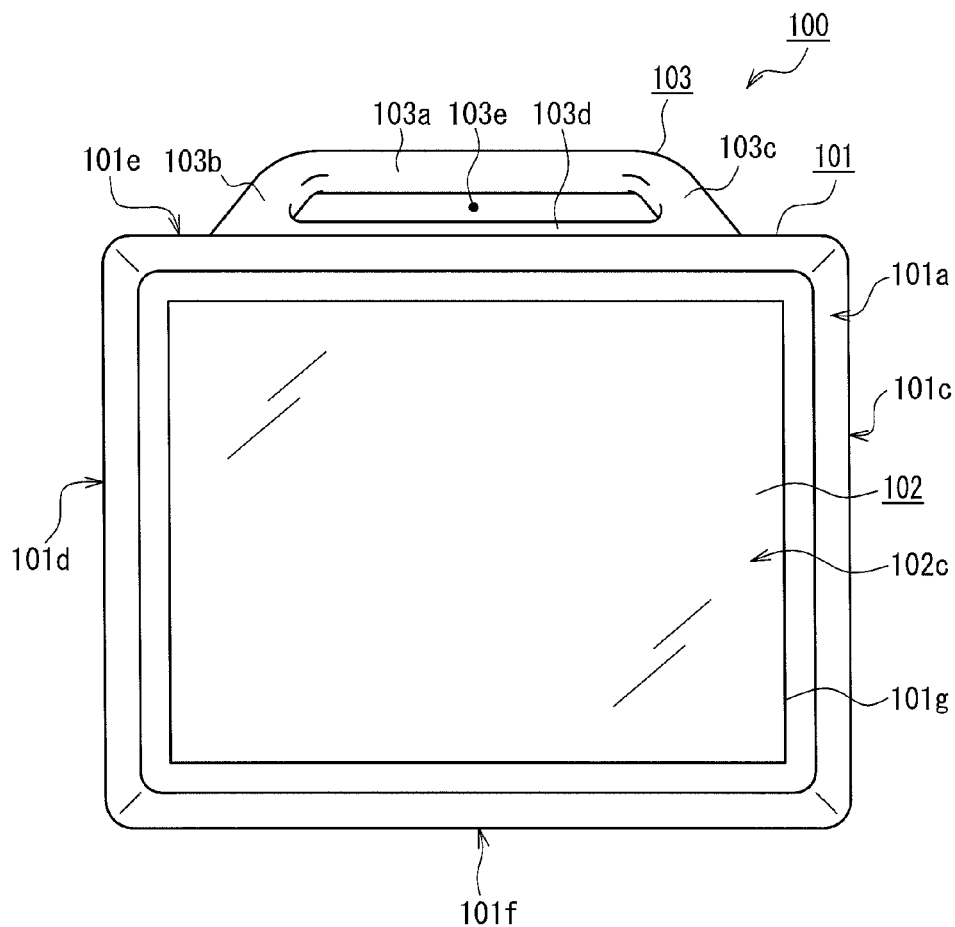
FIG. 1 is a plan view of an electronic apparatus according to Embodiment 1.

One embodiment of the electronic apparatus disclosed in the present application includes a main body part provided with a display portion on a front surface side, and a handle portion having a pair of leg portions with first ends being connected to the main body part, and a grip portion connected to second ends of the leg portions, so as to allow the main body part to be held. The handle portion has a shape such that the grip portion is positioned on a back surface side relative to a main body part thickness direction centerline that is at an equal distance from a front surface and a back surface that is on a side opposite the front surface.

In the electronic apparatus disclosed in the present application, the grip portion is positioned on the back surface side relative to the thickness direction centerline of the main body part. Therefore, when a user holds the electronic apparatus while supporting it on the arm, the bending angle of the wrist for grasping the grip portion is small, and the user's burden can be lessened. Also, when the electronic apparatus set down, the display portion can be tilted. When a user supports the electronic apparatus for hand carrying, the display portion faces obliquely downward and it is thus possible to avoid having the display portion accidentally hit an object.

It is preferable that in the electronic apparatus above, the grip portion of the handle portion is connected to the leg portions via a pair of bent portions with first ends respectively being fixed to the second ends of the leg portions and second ends respectively being fixed to end portions of the grip portion, and an outer edge of each bent portion is defined by a curve having a specific curvature and a specific length. Accordingly, when a user holds the electronic apparatus while supporting it on the arm, the electronic apparatus can be held by placing the fingers along the outer edge of a bent portion.

In this case, it is preferable that the outer edge of each bent portion has a curvature that, when the user's second to fifth fingers are placed thereon, allows the fingers to be evenly spaced, and a length that allows the user's second to fifth fingers to be placed thereon.

It is preferable that the handle portion has a shape such that the grip portion is positioned rearward of the back surface of the main body part. Accordingly, ease of holding for a user and operability of the electronic apparatus when laid on a surface can be further enhanced.

The second embodiment of the electronic apparatus disclosed in the present application includes a main body part having a front surface provided with a display portion and a back surface that is on a side opposite the front surface, and a handle portion having a pair of leg portions with first ends connected to the main body part, a pair of bent portions with first ends respectively fixed to second ends of the leg portions, and a grip portion with end portions to which second ends of the bent portions are respectively fixed, so as to allow the main body part to be held, an outer edge of each bent portion being defined by a curve having a specific curvature and a specific length.

In the second embodiment of the electronic apparatus disclosed in the present application, the leg portions and the grip portion are connected via the bent portions, and the outer edge of each bent portion is defined by a curve having a specific curvature and a specific length. Therefore, when a user holds the electronic apparatus while supporting it on the arm, the electronic apparatus can be held by placing the inside of the second to fifth fingers on a bent portion, so the electronic apparatus can be held stably and a user's burden can be lessened.

It is preferable that the main body part is fixed to a main-body supporting portion including a frame-shaped member that covers at least a part of a side surface, and connected to the leg portions of the handle portion via the main-body supporting portion. Accordingly, the main body part and the handle portion can be formed separately, and an electronic apparatus provided with a handle portion having a configuration suitable for a manner the electronic apparatus is used by a user can be obtained.

Below, a description will now be given in reference to a tablet PC as an example of an electronic apparatus according to Embodiment 1.

Embodiment 1

Figure 2:
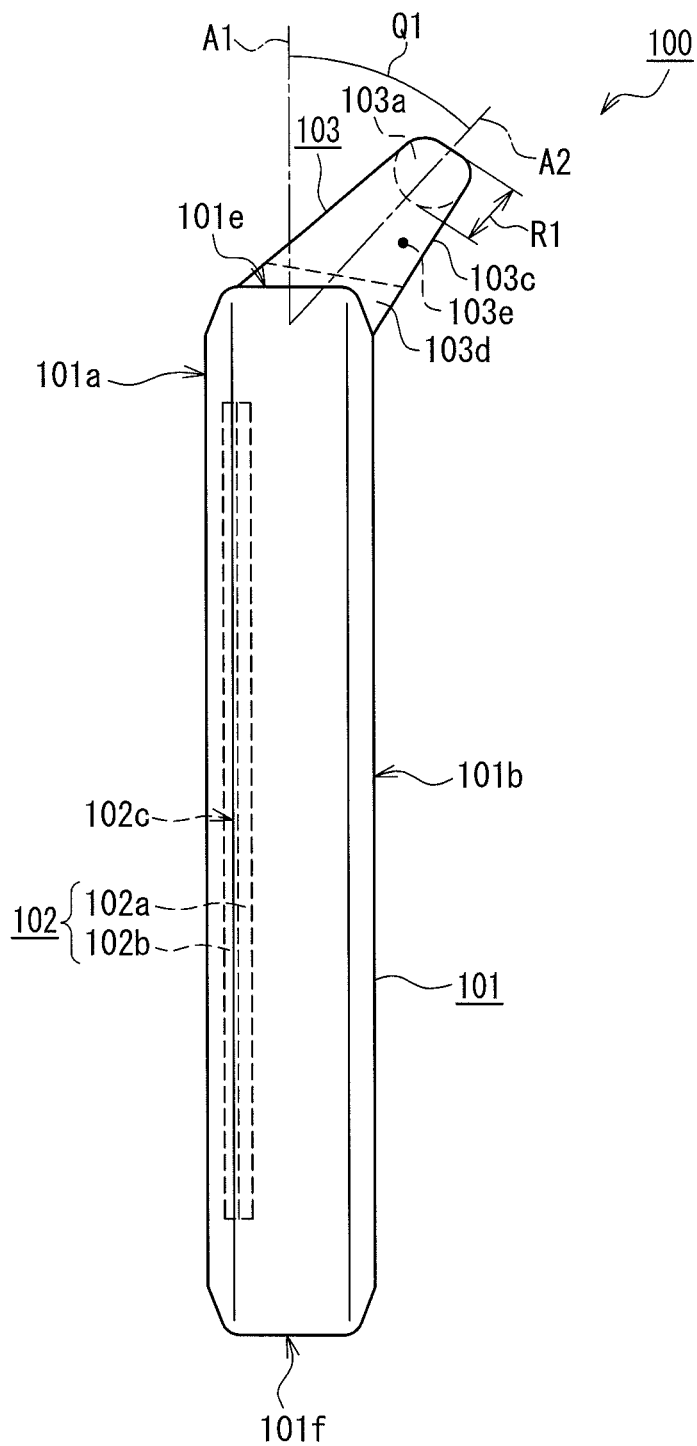
FIG. 2 is a side view of an electronic apparatus according to Embodiment 1.

FIG. 1 is a front view of a tablet personal computer (hereinafter referred to as a tablet PC) 100 according to Embodiment 1. FIG. 2 is a side view of the tablet PC 100. FIG. 2 is an illustration of the tablet PC 100 when a main body part 101 is viewed from the right side surface 101c side.

The tablet PC 100 includes the main body part 101 and a handle portion 103. A case defining the contour of the main body part 101 and a case defining the contour of the handle portion 103 are integrally formed by resin-molding in this embodiment, but a configuration in which the respective cases are separately formed from different components and then combined may be adopted, and the materials of the cases are not limited to resin and may be metal or the like.

The main body part 101 appears to be low-profile and substantially cuboidal (rectangular parallelepiped) in shape. The main body part 101 is provided with a display device 102 that serves as a display portion on a front surface 101a, and contains a central processing unit (CPU), storage devices such as a memory and a hard disk drive, a power circuit, a battery, and the like. The contour of the main body part 101 is defined by the case composed of the front surface 101a, a back surface 101b that is a surface opposite the front surface 101a, the right side surface 101c, a left side surface 101d, an upper surface 101e, and a lower surface 101f. In the front surface 101a, an opening 101g is formed so that a part of the image display area of the display device 102 is externally visible. It is preferable that the main body part 101 is covered with, for example, relatively hard resin such as acrylonitrile styrene (AS)-based resin. The corner portions of the side surfaces of the main body part 101 corresponding to, in particular, the four corners of the front surface 101a and the back surface 101b may be composed of elastomer resin or the like that has flexibility. Such a configuration allows an external shock applied to the tablet PC 100 to be absorbed as much as possible.

The phrase "low-profile substantially cuboidal in shape" refers to a shape similar to a cuboid with the sides in a thickness direction being shortest when the main body part 101 is placed such that the front surface 101a faces upward. Therefore, the shape viewed from above particularly when the front surface 201a faces upward does not need to be perfectly rectangular, and the four corners may be rounded or chamfered. In addition, all of or some of the four sides around the front surface 101a may be curved slightly outward (away from the center of the front surface 101a) or inward (toward the center of the front surface 101a). Moreover, the back surface of 101b of the main body part 101 may have depressions and projections depending on the shapes, positions, and other factors of electric circuit components accommodated in the main body part 101.

The display device 102 includes a display panel 102a and a touch panel 102b. Although the display device 102 of this embodiment is configured such that the display panel 102a and the touch panel 102b overlap, the display device 102 may be configured such that the front glass of the display panel 102a also serves as a constituent member of the touch panel. In addition, it is possible to use a liquid-crystal input-output panel that can be produced by providing light receiving elements in the display pixels of the display panel 102a and that performs image display and touch position detection with one panel.

The display panel 102a can display images based on electrical signals sent from the CPU provided in the main body part 101. In this embodiment, the display panel 102a is embodied by a liquid crystal display panel, but various display panels such as organic or inorganic electroluminescent (EL) panels and plasma display panels can be used.

The touch panel 102b is attached to a place overlapping the image display surface of the display panel 102a. The touch panel 102b is transparent, and an image displayed on the display panel 102a is visible from the outer surface 102c side. In the tablet PC 100 of this embodiment, a capacitive touch panel called a "projected type", in which a specific pattern is formed with a transparent conducting film such as indium tin oxide (ITO) on a transparent substrate, is used as the touch panel 102b. The tablet PC 100 of this embodiment can detect a touch on a plurality of places, i.e., is capable of so-called multi-touch, and therefore a projected capacitive touch panel as described above is used, but the touch panel 102b of this embodiment is not limited to a projected capacitive touch panel, and various other touch panels such as surface capacitive touch panels and resistive membrane touch panels can be used. When the outer surface 102c of the touch panel 102b is pressed with a fingertip, an input pen, or the like, the touch panel 102b can detect the pressed place and can reflect such an entry on the control of the tablet PC 100.

The handle portion 103 has a pair of leg portions 103b, 103c with first ends formed integrally with the upper surface 101e of the main body part 101, and a grip portion 103a connected to the second ends of the leg portions 103b, 103c. In this embodiment, the handle portion 103 is formed integrally with and fixed to a case that serves as the outer shell of the main body part 101, but the handle portion 103 may be connected to the main body part 101 so as to be freely rotatable. Also, the handle portion 103 may be configured to be removably connected to the main body part 101.

For example, connecting the handle portion to the main body part so as to be rotatable allows the handle portion to be stored in a storage portion provided on the back surface side of the main body part when the table PC is not in use, thus enabling reduction of the size of the tablet PC when put away or stored. Also, creating a screw or meshing structure on both the upper or back surface and the handle portion such that the handle portion can be removed when not needed enables reduction of the size of the tablet PC when put away or stored.

The handle portion 103 of the tablet PC 100 of this embodiment includes the grip portion 103a, the first leg portion 103b and the second leg portion 103c that are a pair, a connecting portion 103d, and a through-hole 103e.

The grip portion 103a is formed to be cylindrical such that the cross-section is in a substantially elliptical shape in which the minor diameter is in the direction the leg portions 103b, 103c extend as shown in FIG. 2. The cross-sectional shape of the grip portion 103a is not limited as long as a user can grasp the grip portion 103a with the hand at least without discomfort, and in addition to being elliptical, the shape may be circular, semicircular, triangular, polygonal including rectangular, or the like. The outside diameter R1 in a minor diameter direction of the grip portion 103a is not limited as long as the grip portion 103a has at least a size that allows a user to grasp the grip portion 103a. Although the grip portion 103a shown in FIG. 1 is formed to be linear in a longitudinal direction, for example, the grip portion 103a may have a curved shape such that the central portion in a longitudinal direction is further from the main body part 101 than the end portions are. The cylindrical surface of the grip portion 103a is smooth, but a plurality of small depressions and projections may be formed thereon. Small depressions and projections formed on the cylindrical surface of the grip portion 103a can increase friction between the hand grasping the grip portion 103a and the cylindrical surface, allowing the grip portion 103a to be grasped so as to arrive at a stable position. Also, depressions corresponding to the thicknesses of user's fingers may be provided on the portions where the fingers touch when the grip portion 103a is grasped.

The second end of the first leg portion 103b and the first end of the grip portion 103a are integrally connected to each other, and the first end of the first leg portion 103a and the upper surface 101e of the main body part 101 are integrally connected to each other. The second end of the second leg portion 103c and the second end of the grip portion 103a are integrally connected to each other, and the first end of the second leg portion 103c and the upper surface 101e of the main body part 101 are integrally connected to each other.

The first leg portion 103b and the second leg portion 103c are formed to be substantially polygonal columns, but they may be cylindrical or in other shapes, and their shapes are suitably determined according to the thickness, weight, and like features of the main body part 101 as well as considering, for example, the overall design of the tablet PC 100 including the balance between the main body part 101 and the grip portion 103a. In this embodiment, as shown in FIG. 2, the first leg portion 103b and the second leg portion 103c are formed so as to be continuously tapered from the first ends connected to the main body part 101 toward the second ends, but the thicknesses may be uniform from the first ends to the second ends, and the thicknesses may be increased from the first ends toward the second ends.

The first leg portion 103b and the second leg portion 103c are disposed so as to be tilted toward the back surface 101b side of the main body part 101 as shown in FIG. 2 (only the second leg portion 103c is shown in FIG. 2), and therefore, the grip portion 103a fixed to the second ends is disposed on the back surface 101b side relative to an imaginary line A1 that is the center line in a thickness direction of the main body part 101 and that is at an equal distance from the front surface 101a and the back surface 101b of the main body part 101. Specifically, the first leg portion 103b and the second leg portion 103c are disposed so as to be tilted such that an angle Q1 is formed between the imaginary line A1 that is the centerline in a thickness direction of the main body part 101 and a centerline A2 available when the second leg portion 103c is viewed from the side surface (the same applies to the first leg portion 103b).

The angle Q1 is, for example, 45 degrees in this embodiment. The degree of the angle Q1 formed by the centerline A1 in a thickness direction of the main body part and the centerline A2 available when a leg portion is viewed from a side surface is an example, and is suitably set according to the lengths of the leg portions 103b, 103c as long as the grip portion 103a of the handle portion 103 can be disposed in a desired place.

The connecting portion 103d is formed on the upper surface 101e of the main body part 101 in the direction the grip portion 103a is disposed, and the first end of the connecting portion 103d and the first leg portion 103b are integrally connected to each other, and the second end and the second leg portion 103c are integrally connected to each other.

The through-hole 103e is surrounded by the grip portion 103a, the first leg portion 103b, the second leg portion 103c, and the connecting portion 103d, and penetrates from the front surface 101a side to the back surface 101b side of the main body part 101. The opening area of the through-hole 103e is such as to accept at least the second, third, fourth, and fifth fingers of user's hand.

Figure 3:
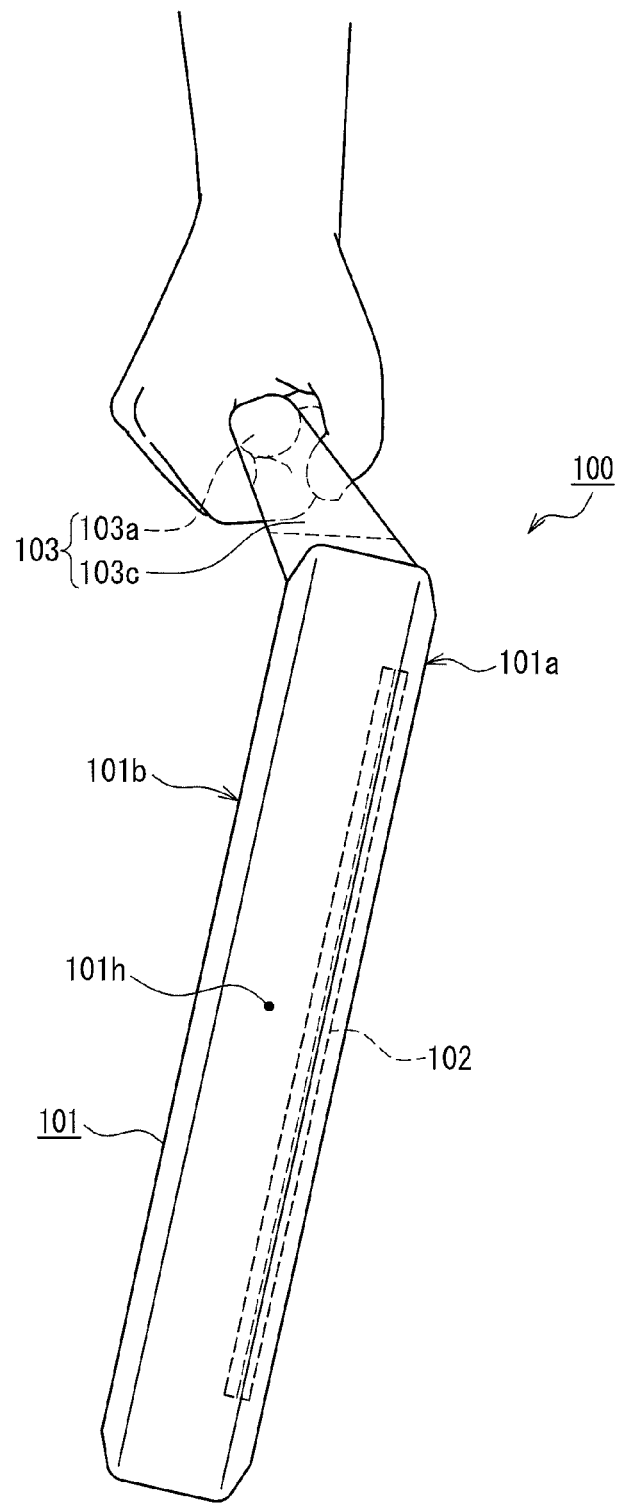
FIG. 3 is a drawing showing a state in which an electronic apparatus according to Embodiment 1 is held by grasping for hand carrying.

The electronic apparatus of this embodiment can be grasped for hand carrying or supported on the arm. The phrase "grasped for hand carrying" refers to a state in which, as shown in FIG. 3, a user grasps the grip portion 103a of the handle portion 103 with the hand, and the main body part 101 is suspended in a vertical direction. The phrase "supported on the arm" refers to a state in which, as shown in FIG. 4, the main body part 101 is laid on user's lower arm, and the grip portion 103a of the handle portion 103 is grasped with the hand.

In the tablet PC 100 of this embodiment, the leg portions 103b, 103c of the handle portion 103 are tilted toward to the back surface side of the main body part 101, and the grip portion 103a is positioned on the back surface 101b side relative to the thickness direction centerline of the main body part. Therefore, when a user holds the tablet PC 100 by grasping for hand carrying, the main body part 101 arrives at an inclined state such that a center of gravity 101h of the main body part 101 is positioned immediately below the grip portion 103a. At this time, the display device 102 disposed on the front surface of the main body part 101 faces obliquely downward, and thus when the tablet PC 100 is transported while being grasped for hand carrying, hitting the outer surface 102c of the display device 102 against a chair, a desk, or other objects can be effectively avoided.

Figure 4:
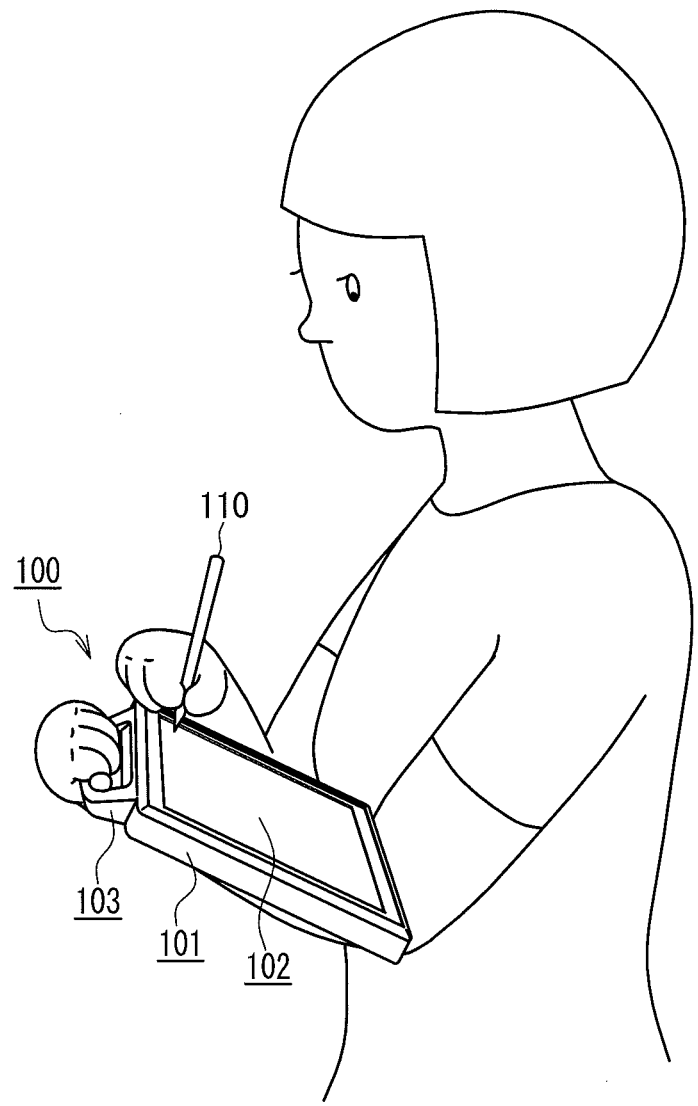
FIG. 4 is a drawing showing a state in which an electronic apparatus according to Embodiment 1 is held while supported on the arm.

FIG. 4 is a drawing showing a state in which a user grasps the grip portion 103a of the handle portion 103 with the left hand and operates the touch panel 102b using an input pen 110 held in the right hand. The main body part 101 is laid on the lower arm of user's left arm. The display device 102 is in a state in which the outer surface 102c serves as the upper side and slightly faces the user.

FIG. 4 shows, as an example, a state in which a user is right-handed, holds the input pen 110 in the right hand, and places the tablet PC 100 on the left arm. Needless to say, there are cases where a user, for example, a left-handed user, holds the input pen 110 in the left hand and places the tablet PC 100 on the right arm. The manner of holding the tablet PC 100 shown in FIG. 4 is not limited to being adopted when the tablet PC 100 is operated, and it may be adopted when the image displayed on the display panel 102a is viewed, when the tablet PC 100 is transported, and like occasions. Below, the manner of supporting the tablet PC 100 on the arm now will be described in detail.

Figure 5:
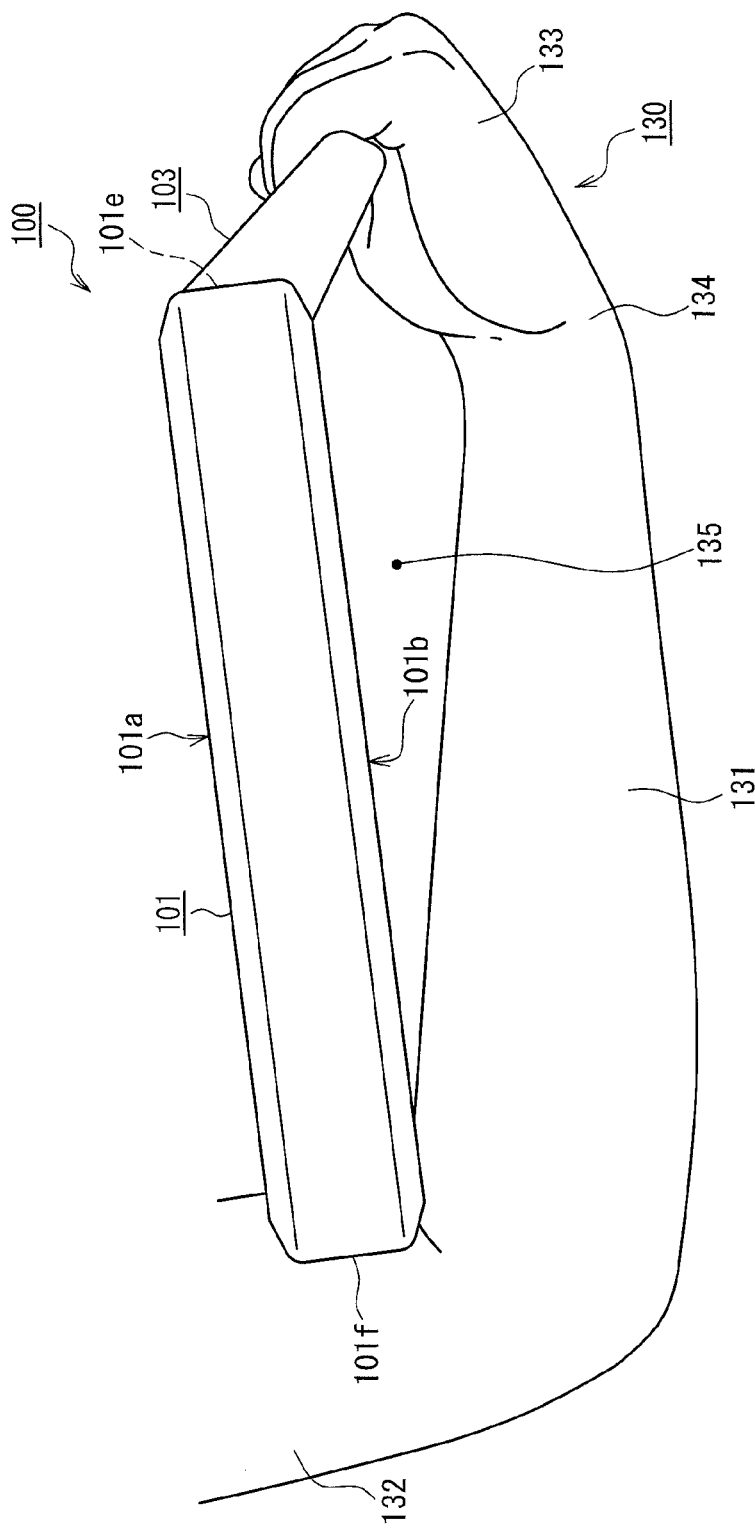
FIG. 5 is a drawing showing the relation between an electronic apparatus and user's arm when the device is held while supported on the arm.

FIG. 5 shows a state of the arm and the tablet PC 100 of a user holding the tablet PC 100 while supporting it on the arm as shown in FIG. 4. In FIG. 5 as well, a state in which a user is right-handed and the tablet PC 100 is placed on the left arm is illustrated.

When the tablet PC 100 is held while supported on the arm, a user first places the tablet PC 100 on a lower arm 131 of a left arm 130, which is not the dominant arm. At this time, the tablet PC 100 is in a state in which the back surface 101b of the main body part 101 is in contact with the lower arm 131, the lower surface 101f faces the upper arm 132 side, and the upper surface 101e and the handle portion 103 face the left hand 133 side.

Next, the first finger of the left hand 133 is put in the through-hole 103e of the handle portion 103 from the back surface 101b side of the main body part 101. Since the palm faces upward, the left hand 133 at this time is in a state facing the back surface 101b. Then, by bending the second, third, fourth, and fifth fingers of the left hand 133, the grip portion 103a of the handle portion 103 is grasped from the outside, that is opposite the main body part 101 side. It is also possible to hold the tablet PC 100 merely by grasping the grip portion 103a from outside with the second, third, fourth, and fifth fingers without putting the first finger in the through-hole 103e.

In the manner of grasping the tablet PC 100 shown in FIG. 5, only a portion of the back surface 101b of the main body part 101, which is near the boundary with the lower surface 101f, is in contact with the lower arm 131, and space 135 is created between the back surface 101b of the main body part 101 and the lower arm 131. In the manner of holding the tablet PC 100 shown in FIG. 5, the lower surface 101f is in contact so as to be pressed against a portion of the upper arm 132 near the elbow. As described above, grasping the grip portion 103a with the left hand 133 and pressing the tablet PC 100 toward the upper arm 132 side by slightly bending a wrist 134 allow the tablet PC to be held more securely.

Depending on the relationship between the size of the tablet PC 100 and the length of user's lower arm 131, there may be a case where the lower surface 101f of the tablet PC 100 is not in contact with the upper arm 132 unlike in FIG. 5. In contrast, when the lower arm 131 of a user is short relative to the size of the tablet PC 100, there may be a case where the tablet PC 100 is not held properly because the lower surface 101f of the tablet PC 100 contacts a portion of the upper arm 132 closer to the shoulder than to the elbow is when grasping the grip portion 103a with the left hand 133. Thus, when the lower arm 131 of a user is short relative to the size of the tablet PC 100, it is also possible to hold the tablet PC 100 not by grasping the grip portion 103a but by placing the second, third, fourth, and fifth fingers in the through-hole 103e and placing the fingertips along the upper surface 101e. Thus, when the tablet PC 100 is held by putting the second, third, fourth, and fifth fingers in the through-hole 103e, since the handle portion 103 is tilted toward the back surface 101b side of the main body part 101 in the tablet PC 100 of this embodiment, the left hand 133 put in the through-hole 103e is not obstructed and since the back of the left hand 133 can be in contact with the surface on the through-hole 103e side of the grip portion 103a, the tablet PC 100 can be held in a more stable manner.

In this embodiment, as shown in FIG. 2, the centerline A2 of the leg portions 103b, 103c is tilted at the angle Q1 relative to the thickness direction centerline A1 of the main body part 101. Therefore, when a user holds the tablet PC by placing it on the arm as shown in FIG. 5, the place of the grip portion 103a is close to user's hand 133 placed on the back surface 101b side, and the bending angle of the wrist 134 for grasping the grip portion 103a is small. When the bending angle of the wrist 134 is small, the strain on the muscles of the left arm 130 is small, and thus the user feels little fatigue.

If the grip portion 103a is disposed in a place overlapping the thickness direction centerline A1 of the main body part 101 shown in FIG. 2, or that is, if the handle portion 103 is disposed so as to protrude in a direction parallel to plane directions of the front surface 101a and the back surface 101b of the main body part 101, the distance between user's hand 133 placed on the back surface 101b side and the grip portion 103a is large. In this state, grasping the grip portion 103a with the hand 133 brings the wrist 134 into a severely bent position, putting the muscles of the arm 130 under severe strain, and the user feels fatigue. When the wrist 134 is severely bent, the space between the wrist 134 and the upper arm 132 is narrow, and there may be a case where a user with short arms, such as a woman or a child, cannot hold the tablet PC 100 while supporting it on the arm. In the electronic apparatus of this embodiment, the grip portion 130a is disposed on the back surface side relative to the thickness direction centerline of the main body part 101, and thus a user feels little fatigue even when grasping the tablet PC 100 for a long period of time, and stable holding can be achieved.

In this embodiment, as shown in FIG. 2, the centerline A2 of the leg portions 103b, 103c is tilted at the angle Q1 relative to the thickness direction centerline A1 of the main body part 101, and therefore when a user holds the tablet PC while placing it on the arm as shown in FIG. 5, the space 135 is created between the main body part 101 and the lower arm 131, and heat released from the main body part 101 is not likely to reach the lower arm 131. Therefore, user discomfort is even more unlikely to be developed. In the tablet PC 100 of this embodiment, the grip portion 103a is positioned on the back surface side relative to the thickness direction centerline of the main body part 101, and therefore, the area of contact between user's arm and the surface of the case of the main body part 101 of the tablet PC 100, whose the temperature may increase because heat sources such as a CPU and a hard disk drive are presents can be small.

Figure 6:
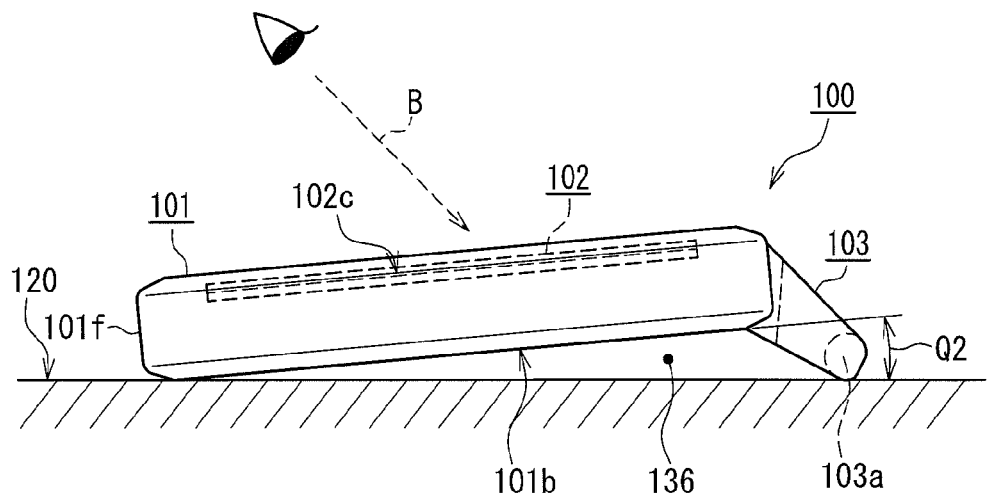
FIG. 6 is a side view of an electronic apparatus according to Embodiment 1 laid on a flat surface.

FIG. 6 shows a state in which the tablet PC is used while being laid on a flat surface of, for example, a desk.

As shown in FIG. 6, when the tablet PC 100 of this embodiment is laid on a surface 120 such as a table top, the end on the bottom surface 101f side of the back surface 101b of the main body part 101 and the grip portion 103a of the handle portion 103 are in contact with the surface 120. Since the centerline A2 of the leg portions 103b, 103c of the handle portion 103 is disposed so as to be tilted at the angle Q1 relative to the thickness direction centerline A1 of the main body part 101, the main body part 101 is tilted at an angle Q2 relative to the surface 120. When an image is displayed on the display panel 102a, by displaying the image such that the upper side of the image is on the handle portion 103 side on the display panel 102a, the upper side of the image is higher than the lower side of the image relative to the surface 120. Therefore, when the image displayed on the display panel 102a is viewed from the direction indicated by an arrow B, the display surface 102c of the display panel 102a is tilted toward the user side, and therefore it is easy for the user to view the displayed image and also to operate the touch panel 102b.

Moreover, as shown in FIG. 6, when the tablet PC 100 is laid on the surface 120 that has a flat surface, space 136 is created between the back surface 101b of the main body part 101 and the surface 120. Accordingly, even when a battery or the like is disposed so as to protrude on the back surface 101b, the tablet PC 100 can be in a stable position.

Moreover, since the grip portion 103a of the handle portion 103 is disposed so as to be rearward of the back surface 101b of the main body part 101, when the tablet PC 100 is accidentally dropped onto the floor or a like object, the handle portion 103 may be able to absorb the impact of hitting such an object. For example, when the tablet PC 100 is dropped onto the floor or a like object while the back surface 101b of the main body part 101 faces vertically downward, the handle portion 103 sometimes hits such an object sooner than the main body part 101 does. When the handle portion 103 hits such an object first, the handle portion 103 absorbs the impact of hitting. Therefore, the impact on the main body part 101 can be reduced, and damage to a precision apparatus such as a hard disk drive contained in the main body part 101 can be avoided.

In the foregoing description of the embodiment, examples and descriptions are provided assuming that the angle Q1 formed by the thickness direction centerline A1 of the main body part 101 and the centerline A2 of the leg portions 103c, 103d is at 45 degrees. Therefore, as shown in FIG. 2, in the tablet PC 100 of this embodiment, the grip portion 103a is entirely positioned rearward of the back surface 101b of the main body part 101. However, the electronic apparatus disclosed in the present application is not limited to an electronic apparatus in which a grip portion is positioned rearward of the back surface of a main body part. For example, a portion of a grip portion may be positioned rearward of the back surface of a main body part, and the rest may be positioned immediately above the upper surface of the main body part. There may be a case where the entire grip portion is positioned immediately above the upper surface of the main body part and on the back surface side relative to the thickness centerline but not rearward of the back surface of the main body part, for example, a case where the thickness of the main body part is greater than the diameter of the grip portion or the size of the grip portion in the thickness direction of the main body part. Thus, the grip portion entirely positioned in a region immediately above the upper surface of the main body part and not rearward of the back surface does not allow the main body part to be tilted relative to the table top or the like when the tablet PC is laid thereon as shown in FIG. 6. However, even when the grip portion is entirely positioned in a region immediately above the upper surface of the main body part and not rearward of the back surface, as long as the grip portion is positioned on the back surface side relative to the thickness centerline of the main body part, the effect by which the display surface faces obliquely downward when the electronic apparatus is grasped for hand carrying as shown with FIG. 3, and the effect by which user's burden is reduced and the electronic apparatus can be securely held when the electronic apparatus is supported on the arm as described using FIGS. 4 and 5 can be attained. Therefore, in the electronic apparatus disclosed in this embodiment, it is preferable that the angle Q1 at which the leg portions of the handle portion are tilted toward the back surface side is set from the viewpoint of how far the grip portion should be positioned from the thickness direction centerline of the main body part toward the back surface side while taking the lengths and the shapes of the leg portions of the handle portion in consideration.

The shapes of the leg portions also are not limited to shapes that appear to be linear in the side view shown in FIG. 2, and the leg portions may take shapes that appear to be curved toward the back surface side or shapes that appear to be bent in the middle toward the back surface side on the side view.

The place where the first leg portion 103b is connected to the upper surface 101e of the main body part 101 is distant from a place near the boundary between the upper surface 101e and the left side surface 101d in this embodiment as shown in FIG. 1, but it may be disposed in a place near the boundary between the upper surface 101e and the left side surface 101d, or on the left side surface 101d. Also, the place where the second leg portion 103c is connected to the upper surface 101e of the main body part 101 is distant from a place near the boundary between the upper surface 101e and the right side surface 101c in this embodiment as shown in FIG. 1, but it may be disposed in a place near the boundary between the upper surface 101e and the right side surface 101c, or on the right side surface 101c.

The grasped state shown in FIG. 5 is an example, and depending on the length and the thickness of the arm and the size of the hand of a user or other features, the position where the main body part 101 is placed on the lower arm 131, the position of the main body part 101 relative to the upper arm 132, the size of the space 135, and the like vary. According to the tablet PC 100 of this embodiment, the manner of grasping the grip portion 103a may be such that the back of the hand is in a position facing the back surface 101b of the main body part 101, or that is, a manner in which fingers are put through the through-hole 103e of the handle portion 103 from the back surface and the grip portion 103a is grasped, can be adopted.

Also, the procedure of grasping described above is an example, and, for example, the procedure of grasping may be such that the grip portion 203a is grasped with the left hand 233, and then the main body part 201 is laid on the lower arm 231. In the case where the left hand is a dominant hand, the procedure of grasping may be such that the grip portion 203a is grasped with the right hand, and the main body part 201 is laid on the right lower arm.

Embodiment 2

Below, a description is given in reference to a tablet PC as an example of an electronic apparatus according to Embodiment 2.

Figure 7:
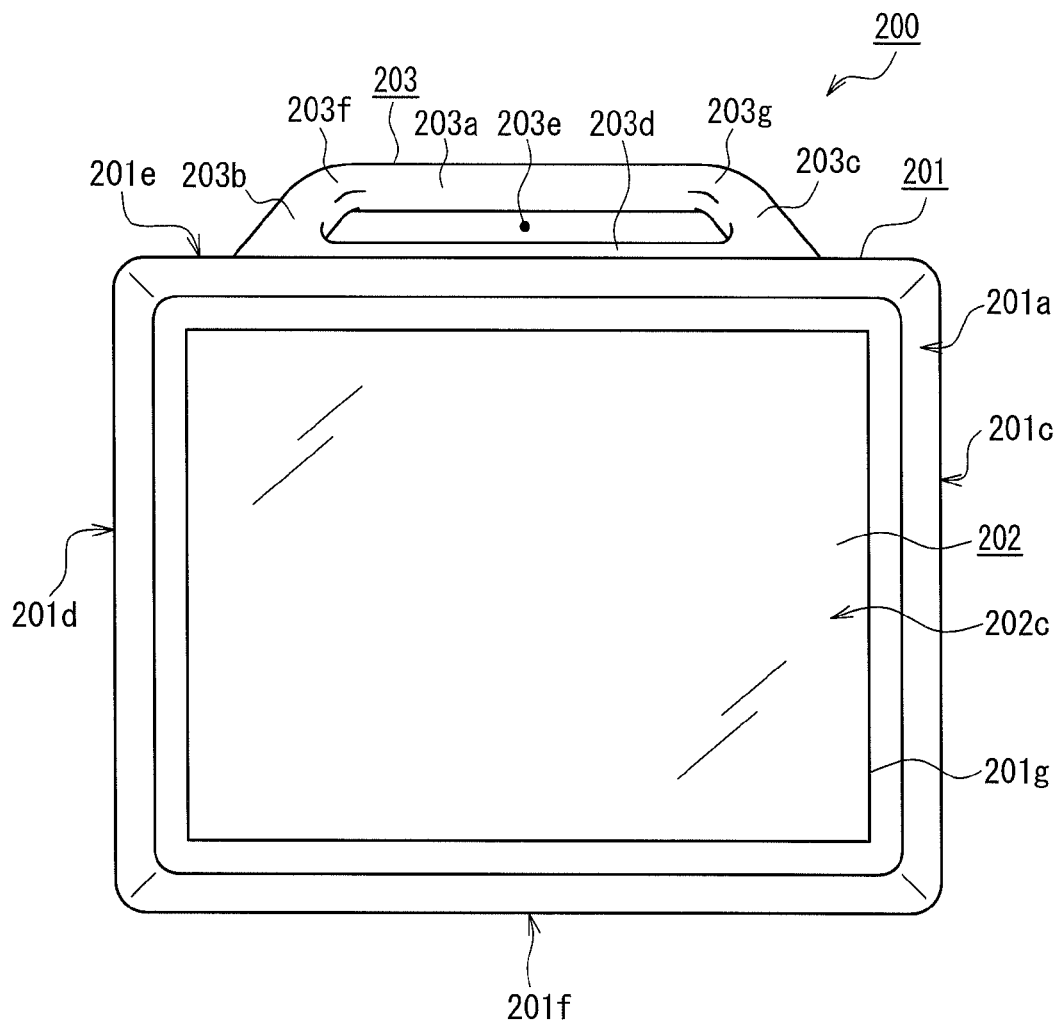
FIG. 7 is a plan view of an electronic apparatus according to Embodiment 2.
Figure 8:
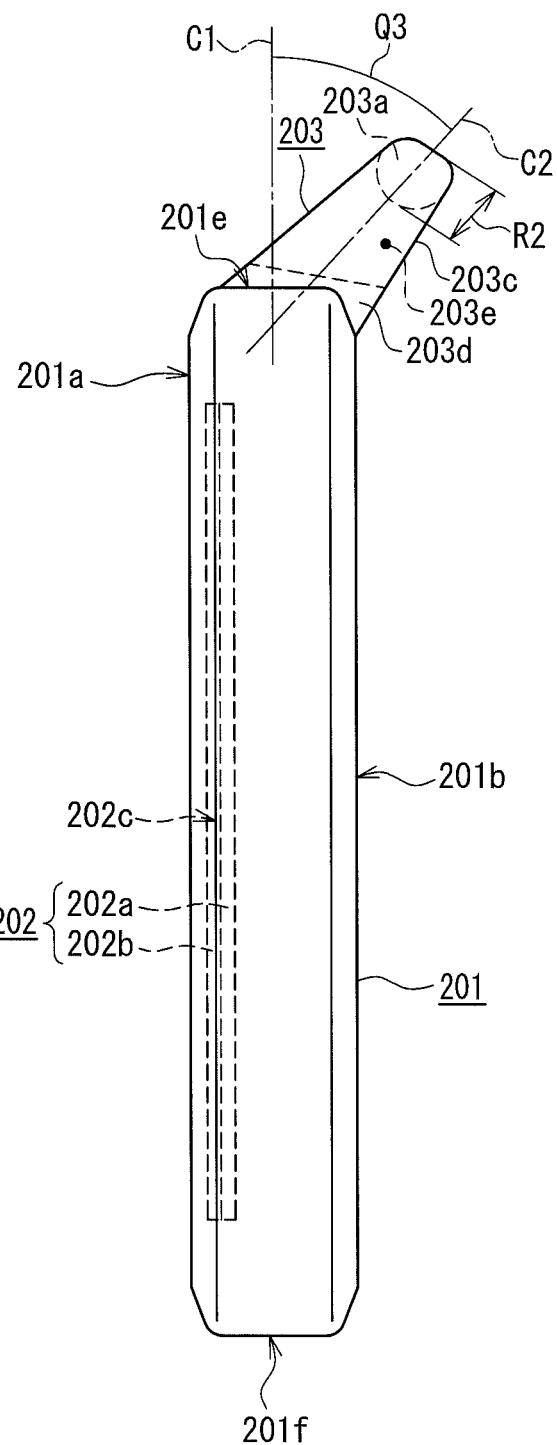
FIG. 8 is a side view of an electronic apparatus according to Embodiment 2.
Figure 9:
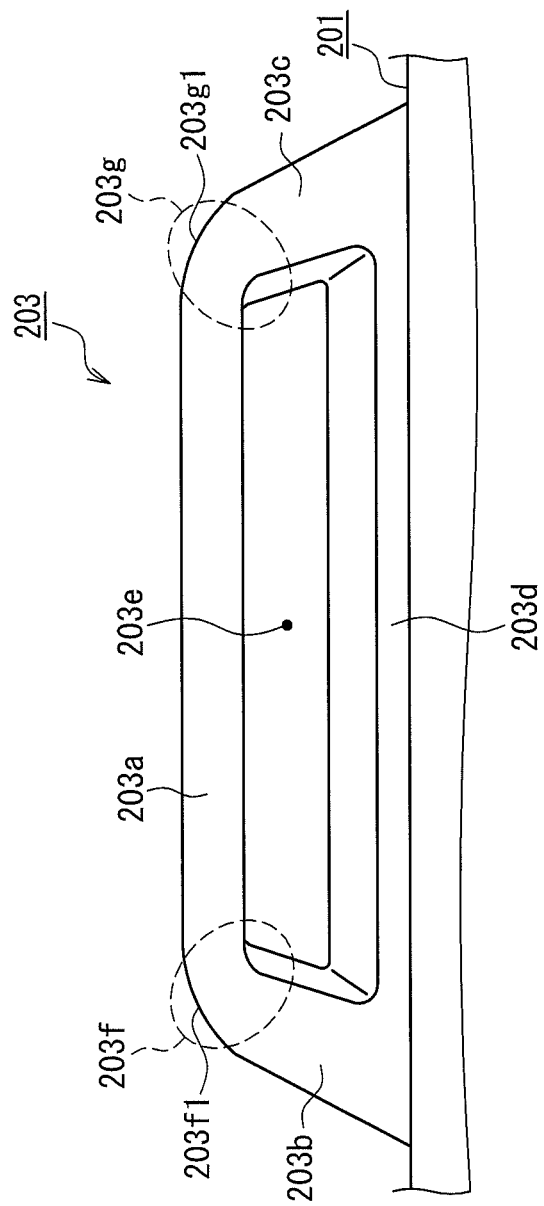
FIG. 9 is a plan view of a handle portion according to Embodiment 2.

FIG. 7 is a front view of a tablet PC 200 according to Embodiment 2. FIG. 8 is a side view of the tablet PC 200. FIG. 8 is an illustration of the tablet PC 200 when a main body part 201 is viewed from the right side surface 201c side. FIG. 9 is a plan view of a handle portion 203 provided on the tablet PC 200. In the configuration of the main body part 201 shown in FIGS. 7 and 8, the tablet PC 200 according to Embodiment 2 has the same configuration as the tablet PC 100 according to Embodiment 1 shown in FIGS. 1 and 2. Therefore, the components constituting the main body part 201 are given numerical references in the 200s corresponding to the numerical references in the 100s given to the main body part 101 of Embodiment 1, and their detailed descriptions are omitted.

Specifically, the tablet PC 200 includes the main body part 201 and the handle portion 203. The main body part 201 is provided with a display device 202 on a front surface 201a, contains a central processing unit (CPU), storage devices such as a memory and a hard disk drive, a power circuit, a battery, and the like, and appears low-profile substantially cuboidal in shape, with the contour being defined by a case composed of the front surface 201a, a back surface 201b, a right side surface 201c, a left side surface 201d, an upper surface 201e, and a lower surface 201f. In the front surface 201a, an opening 201g is formed so that a part of the image display area of the display device 202 is externally visible.

The display device 202 includes a display panel 202a and a touch panel 202b, and the display panel 202a can display images based on electrical signals sent from the CPU provided in the main body part 201. The touch panel 202b is attached to a place overlapping the image display surface of the display panel 202a and is transparent, and an image displayed on the display panel 202a is visible from the outer surface 202c side. When an outer surface 202c of the touch panel 202b is pressed with a fingertip, an input pen, or the like, the touch panel 102b can detect the pressed place and can reflect such an entry on the control of the tablet PC 200. The configuration of the main body part 201 above is only an example, and as with the main body part 101 described in Embodiment 1, the main body part 201 may adopt a variety of different configurations.

As shown in FIGS. 7 and 9, in the handle portion 203, a pair of leg portions 203b, 203c with first ends fixed to the main body part 201 are connected to a grip portion 203a via a pair of bent portions 203f, 203g with first ends respectively connected to second ends of the leg portions 203b, 203c and with second ends respectively connected to end portions of the grip portion 203a. The handle portion 203 of this embodiment may also be fixed to the main body part 201 so as to be freely rotatable. Also, the handle portion 203 may be configured to be removably fixed to the main body part 201.

The grip portion 203a is formed to be cylindrical such that the cross-section is in a substantially elliptical shape in which the minor diameter is in the direction the leg portions 203b, 203c extend as shown in FIG. 8. The cross-sectional shape of the grip portion 203a is not limited as long as a user can grasp the grip portion 203a without discomfort, and the shape may be circular, semicircular, polygonal, or the like. The outside diameter R2 on in a minor diameter direction of the grip portion 203a is not limited as long as the grip portion 203a has a size that allows a user to grasp the grip portion 203a. Although the grip portion 203a shown in FIG. 7 is formed to be linear in a longitudinal direction, for example, the grip portion 203a may have a curved shape such that the central portion in a longitudinal direction is further from the main body part 201 than the end portions are. The cylindrical surface of the grip portion 203a is smooth, but a plurality of small depressions and projections may be formed thereon, and also, depressions corresponding to the thicknesses of user's fingers may be provided on the portions where the fingers touch when the grip portion 203a is grasped. The first bent portion 203f is connected to the first end of the grip portion 203a in a longitudinal direction. The second bent portion 203g is connected to the second end of the grip portion 203a in a longitudinal direction.

The first leg portion 203b and the second leg portion 203c are formed to be substantially polygonal columns, but they may be cylindrical or in other shapes. The first leg portion 203b and the second leg portion 203c are formed so as to be continuously tapered from the first ends connected to the main body part 201 toward the second ends connected to the bent portions 203f, 203g, but the thicknesses may be uniform from the first ends to the second ends, and the thicknesses may be increased from the first ends toward the second ends.

The first leg portion 203b and the second leg portion 203c are disposed so as to be tilted toward the back surface 201b side of the main body part 201 as shown in FIG. 8 (only the second leg portion 203c is shown in FIG. 8), and therefore, the grip portion 203a fixed to the second ends via the bent portions 203f, 203g is disposed on the back surface 201b side relative to an imaginary line C1 that is the center line in a thickness direction of the main body part 201 and that is at an equal distance from the front surface 201a and the back surface 201b of the main body part 201. Specifically, the first leg portion 203b and the second leg portion 203c are disposed so as to be tilted such that an angle Q3 is formed between the imaginary line C1 that is the centerline in a thickness direction of the main body part 201 and a centerline C2 available when the second leg portion 203c is viewed from the side surface (the same applies to the first leg portion 203b). In this embodiment as well, the angle Q3 is at 45 degrees although this is an example. The degree of the angle Q3 formed by the centerline C1 in a thickness direction of the main body part 201 and the centerline C2 available when the leg portion 203 is viewed from a side surface is suitably set according to the lengths of the leg portions 203b, 203c as long as the grip portion 203a of the handle portion 203 can be disposed in a desired place. The first end of the connecting portion 203d and the first leg portion 203b are integrally connected to each other, and the second end and the second leg portion 203c are integrally connected to each other. A through-hole 203e is surrounded by the grip portion 203a, the first leg portion 203b, the first bent portion 203f, the second leg portion 203c, the second bent portion 203g, and the connecting portion 203d, and penetrates from the front surface 201a side to the back surface 201b side of the main body part 201. The opening area of the through-hole 203e is such that at least the second, third, fourth, and fifth fingers of the hand can be put through.

The handle portion 203 of the tablet PC 200 of Embodiment 2 has the first bent portion 203f and the second bent portion 203g.

The first end of the first bent portion 203f is connected to the second end side of the first leg portion 203b, and the second end is connected to an end portion of the grip portion 203a. The first end of the second bent portion 203g is connected to the second end side of the second leg portion 203c, and the second end is connected to an end portion of the grip portion 203a opposite the end portion to which the first bent portion 203f is connected. That is, the first bent portion 203f and the second bent portion 203g are disposed so as to link the leg portions 203b, 203c and the grip portion 203a.

It is preferable that the pair of bent portions, namely the first bent portion 203f and the second bent portion 203g, have circular cross-sectional shapes in view of ease of grasping by a user, but the cross-sectional shapes are not limited to being circular. Since the bent portions 203f, 203g are components that link the grip portion 203a and the leg portions 203b, 203c, it is preferable that the bent portions 203f, 203g have cross-sectional shapes that change in a continuous manner from the cross-sectional shape of the grip portion 203a to the cross-sectional shapes of the leg portions 203b, 203c.

As shown in FIG. 9, the outer side of the handle portion 203 in the first bent portion 203f, or that is, the outer edge 203f1 on the side far from the main body part 201 as well as the outer edge 203g1 in the second bent portion 203g both have gradually curved shapes. Giving a specific curvature and a specific length to the curved shapes of the outer edge 203f1 of the first bent portion 203f and the outer edge 203g1 of the second bent portion 203g allows support on the arm using the bent portions 203f, 203g.

Figure 10:
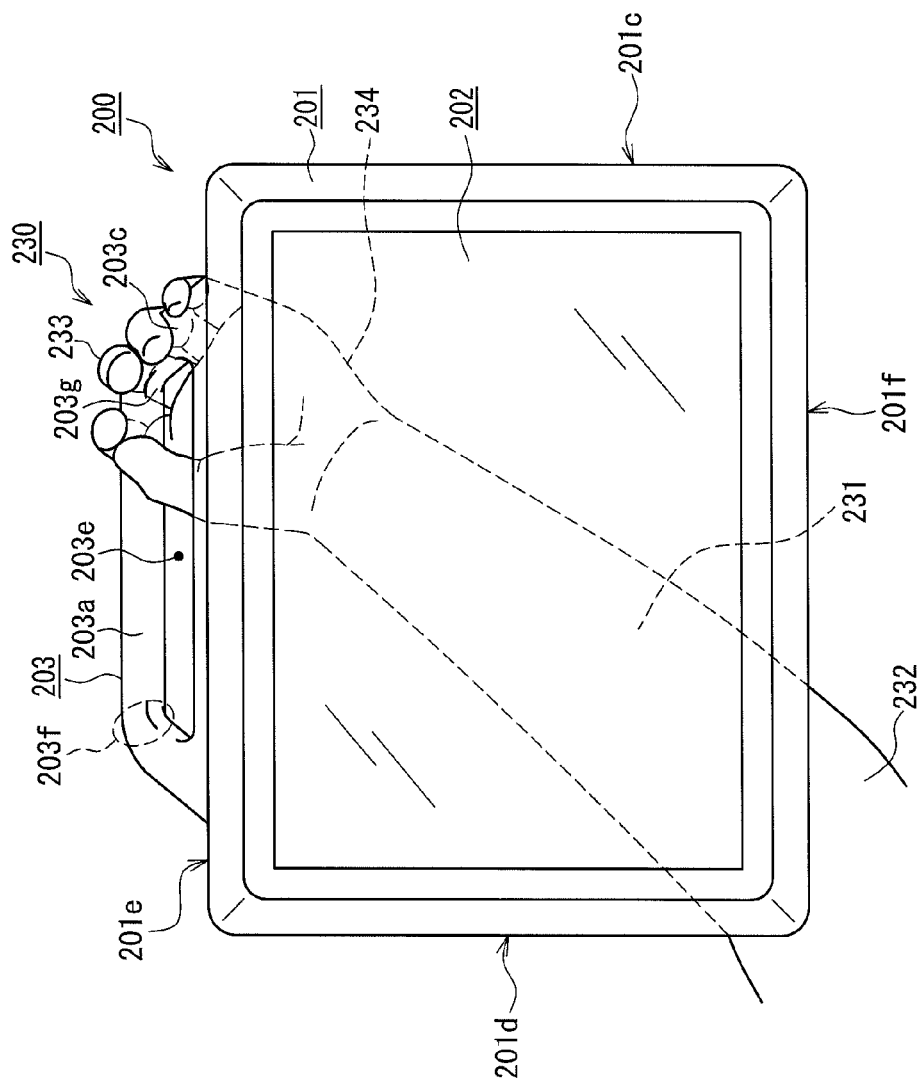
FIG. 10 is a drawing showing a state in which an electronic apparatus according to Embodiment 2 is held while supported on the arm using a bent portion.

FIG. 10 shows a state in which a user holds the tablet PC 200 of Embodiment 2 by placing it on the arm using the bent portions 203f, 203g formed in the handle portion 203 of the tablet PC.

Figure 11:
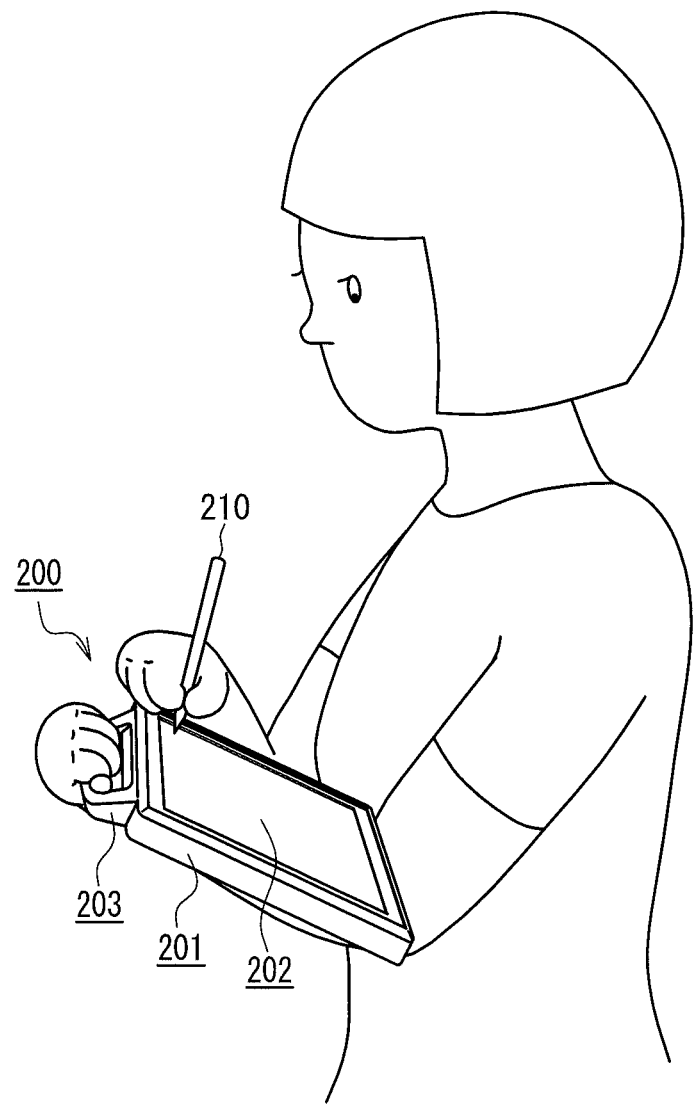
FIG. 11 is a drawing showing a state in which an electronic apparatus according to Embodiment 2 is held while supported on the arm.

When a user grasps the grip portion 203a and supports the tablet PC 200 by placing it on the arm, in the tablet PC 200 of this embodiment as well, as shown in FIG. 11, as with the tablet PC 100 of the first embodiment, the tablet PC 200 can be held by grasping the grip portion 203a. In this case, the user holds the tablet PC 200 by grasping the grip portion 203a while applying the arm (left arm in FIG. 11) to the central portion in a horizontal direction of the back surface 201b of the main body part 201 of the tablet PC 200. However, since the tablet PC 200 having a certain width and a low-profile substantially cuboidal shape is supported by applying the arm only to the central portion in a horizontal direction of the back surface 201b, it is difficult to suppress the twisting motion of the tablet PC 200 in a horizontal direction, for which the supported central portion in a horizontal direction serves as an axis. In particular, as shown in FIG. 11, when the touch panel 202b is operated using the input pen 210, an image displayed on a portion near a horizontal edge of the display panel 202a may be touched, and a twisting motion in a horizontal direction, for which the above-described tablet PC central portion serves as an axis, is likely to occur.

In contrast, in the case of the tablet PC 200 of this embodiment, as shown in FIG. 10, when the tablet PC 200 is held with a left arm 230, the left hand can be applied to the outer edge 203g1 of the second bent portion 203g. When a user grasps the tablet PC 200 using the outer edge 203g1 of the second bent portion 203g, the lower arm 231 can be disposed in a position near a diagonal line of the back surface 201b of the main body part 201. That is, since the second bent portion 203g is positioned near the boundary between the upper surface 201a and the right side surface 201c of the main body part 201, the left hand 233 grasping the second bent portion 203g is positioned near the boundary between the upper surface 201a and the right side surface 201c. Then, by disposing the upper arm 232 side of the lower arm 231 near the boundary between the left side surface 201d, the lower surface 201f, and the back surface 201b, the lower arm 231 is disposed in a place extending near a diagonal line (diagonal line extending from the upper right corner to the lower left corner of the main body part 201 in FIG. 10) of the back surface 201b. Accordingly, the lower arm 231 can support a place extending through the center of gravity located in the central portion of the main body part 201 of the tablet PC 200 from the back surface 201b, and support the tablet PC 200 in a diagonal direction relative to the main body part 201. Therefore, compared with the case where the central portion in a horizontal direction is supported as shown in FIG. 11, the twisting motion of the held tablet PC 200 can be prevented effectively. As a result, the position of the tablet PC 200 held by the user is stabilized. In particular, the position of the tablet PC 200 when the user operates the touch panel 202b is stabilized.

In this embodiment, the second bent portion 203g is connected to the grip portion 203a and the second leg portion 203c, and the outer edge 203g1 thereof is in a curved shape having a specific curved surface. Therefore, when a user grasps the second bent portion 203g with the left hand 233 without bending a wrist 234, the lower arm 231 is disposed near a diagonal line of the back surface 201b. That is, as shown in FIG. 10, by applying the left hand 233 to the bent portion 203g on the upper right side of the tablet PC 200, the user can hold the tablet PC 200 in a natural position, and therefore, a feeling of fatigue can be lessened. When a user supports the tablet PC 200 on the right arm, the user grasps the first bent portion 203f with the right hand, and the lower right arm is disposed in a place extending through substantially the central portion of the back surface 201b of the main body part 201 along a diagonal line (diagonal line from upper left to lower right).

Since the handle portion 203 of the tablet PC 200 of this embodiment as well includes the leg portions 203b, 203c, the grip portion 203a, and the through-hole 203e, grasping for hand carrying as shown in FIG. 3 and supporting on the arm attained by grasping the grip portion 203a of the handle portion 203 as shown in FIG. 4 and in FIG. 11 that is referred to above in connection with this embodiment can be achieved as with the tablet PC 100 of the first embodiment. In the case of supporting on the arm shown in FIG. 11, the relationship between user's arm and hand and the tablet PC 200 is the same as that described using FIG. 5 in the Embodiment 1. In the handle portion 203 of the tablet PC 200 of this embodiment as well, since the grip portion 203a is positioned rearward of the back surface 201b of the main body part 201 as shown in FIG. 8, when the tablet PC 200 is laid on a surface such as a desk, the display panel 203a can be tilted due to the handle portion 203 as described using FIG. 6 in Embodiment 1, thus enhancing user friendliness. The handle portion 203 has a shape protruding beyond the back surface 201b of the main body part 201, and thus when the tablet PC 200 is accidentally dropped onto the floor or the like, it can be hoped that the handle portion 203 can demonstrate an impact absorbing effect.

As described above, according to this embodiment, since the handle portion 203 includes the bent portions 203f, 203g, it is possible for a user to dispose the lower arm 231 on a diagonal line on the back surface 201b of the main body part 201 of the tablet PC 200 using the bent portions 203f, 203g as shown in FIG. 10. Accordingly, the center of gravity of the tablet PC 200 can be supported with the lower arm, and the main body part 201 can be supported in an oblique direction. Therefore, the user can hold the tablet PC 200 in a stable position.

At this time, it is preferable that the outer edge 203f1 of the first bent portion 203f and the outer edge 203g1 of the second bent portion 203g have curved shapes such that user's second to fifth fingers are positioned at equal intervals when the user grasps the bent portion 203f or 203g with the hand. Thus, by giving the outer edge 203f1 of the first bent portion 203f and the outer edge 203g1 of the second bent portion 203g specific curved shapes such that user's second to fifth fingers have equal intervals, the hand supporting the tablet PC 200 is brought into a natural position, and fatigue felt by the user can be lessened. For example, if the handle portion is in a shape that does not have a bent portion and in which the grip portion and the leg portions are connected perpendicularly, for example, the second and third fingers come into contact with the grip portion and the fourth and fifth fingers come into contact with a leg portion when a user tries to grasp with the left hand the portion where the grip portion and the leg portion are connected to each other. Such an arrangement of the fingers creates a large space only between the third and fourth fingers and brings the left hand into an unnatural position, and therefore, the user feels intense fatigue in the left hand. In contrast, with the tablet PC 200 of this embodiment, the user's fatigue can be lessened even when the tablet PC 200 is supported on the arm for a long period of time, and a sense of holding stability particularly when an input operation with the input pen 210 is performed can be enhanced.

In this embodiment, the handle portion 203 is configured to be disposed so as to be tilted toward the back surface 201b side of the main body part 201 as shown in FIG. 8, but as long as the bent portions 203f, 203g respectively are provided between the grip portion 203a and the leg portions 203b, 203c, the handle portion 203 may be configured to be disposed so as to protrude from the upper surface 201e in a plane direction of the back surface 201b, i.e., in the direction of the imaginary line C1 in FIG. 8.

Figure 12:
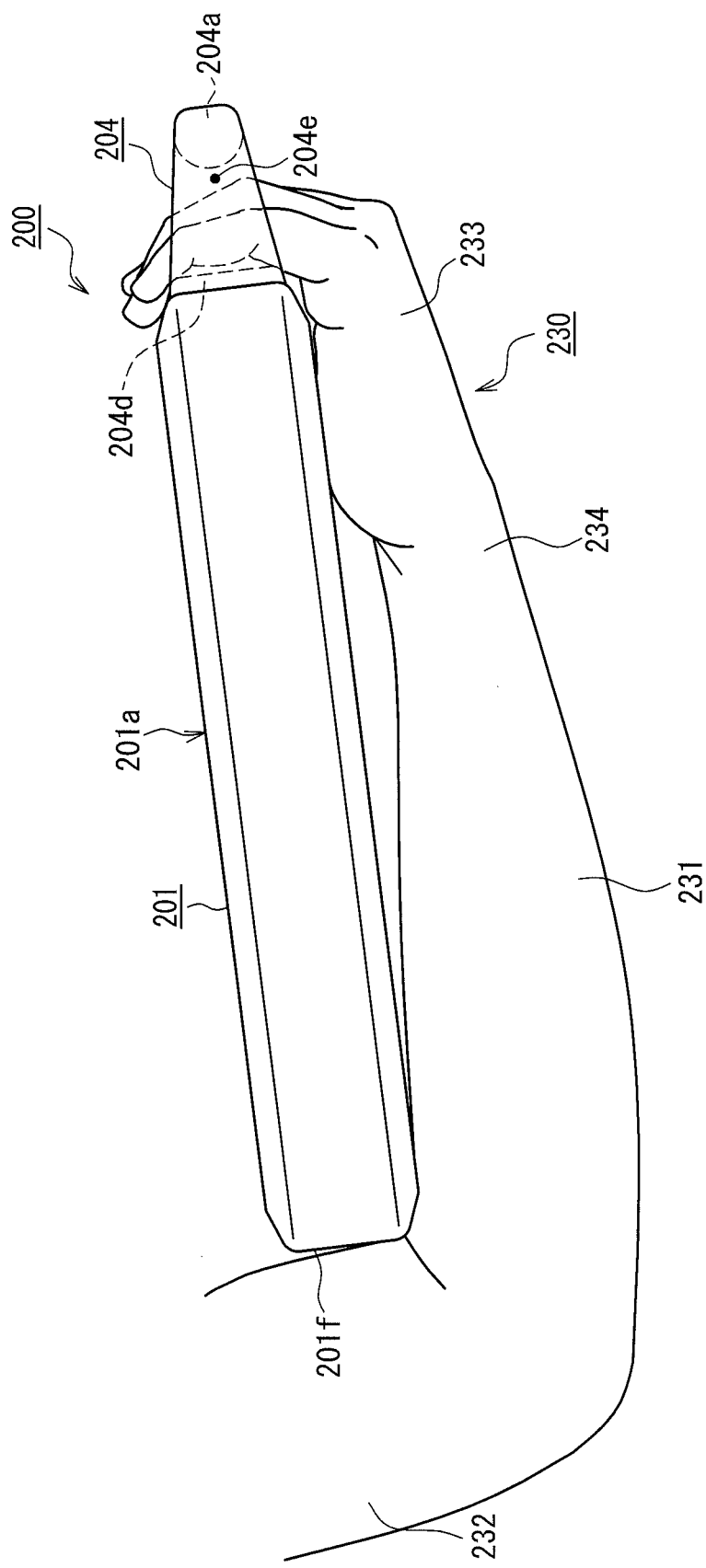
FIG. 12 is a side view showing Modification Example 1 of an electronic apparatus according to Embodiment 2.

FIG. 12 is a side view showing Modification Example 1 of the electronic apparatus disclosed in the present application.

The tablet PC 200 shown in FIG. 12 includes a handle portion 204 protruding from the upper surface 201e of the main body part 201 in a plane direction of the front surface 201a and the back surface 201b. A grip portion 204a, a connecting portion 204d, and a through-hole 204e shown in FIG. 12 are configured identically with the grip portion 203a, the connecting portion 203d, and the through-hole 203e shown in FIG. 7, respectively. Although not shown, the handle portion 204 shown in FIG. 12 includes the same bent portions as the first bent portion 203f and the second bent portion 203g shown in FIG. 9. In addition to the case where a user holds the tablet PC 200 while supporting it on the arm using a bent portion, it is possible to support the tablet PC 200 also by placing the second to fifth fingers in the through-hole 204e and placing the main body part 201 on the lower arm 231 as shown in FIG. 12. Supporting the lower surface 201f of the main body part 201 with the upper arm 232 enables the main body part 201 to be sandwiched between the second to fifth fingers and the upper arm 232, thus enhancing the positional stability of the tablet PC 200. When the space between the second to fifth fingers placed in the through-hole 204e and the grip portion 204a is small, or when there is almost no such space, by bringing the back side of the second to fifth fingers into contact with the grip portion 204a so as to bring the palm into contact with the back surface 201b of the main body part 201, the tablet PC 200 can be held with the left arm 230.

In the foregoing description of the tablet PC 200 of this embodiment, the place where the first leg portion 203b is connected to the upper surface 201e of the personal computer main body part 201 is spaced from the boundary between the upper surface 201e and the left side surface 201d as shown in FIG. 7. Also, the place where the second leg portion 203c is connected to the upper surface 201e of the main body part 201 is spaced from the boundary between the upper surface 201e and the right side surface 201c as shown in FIG. 7.

Figure 13:
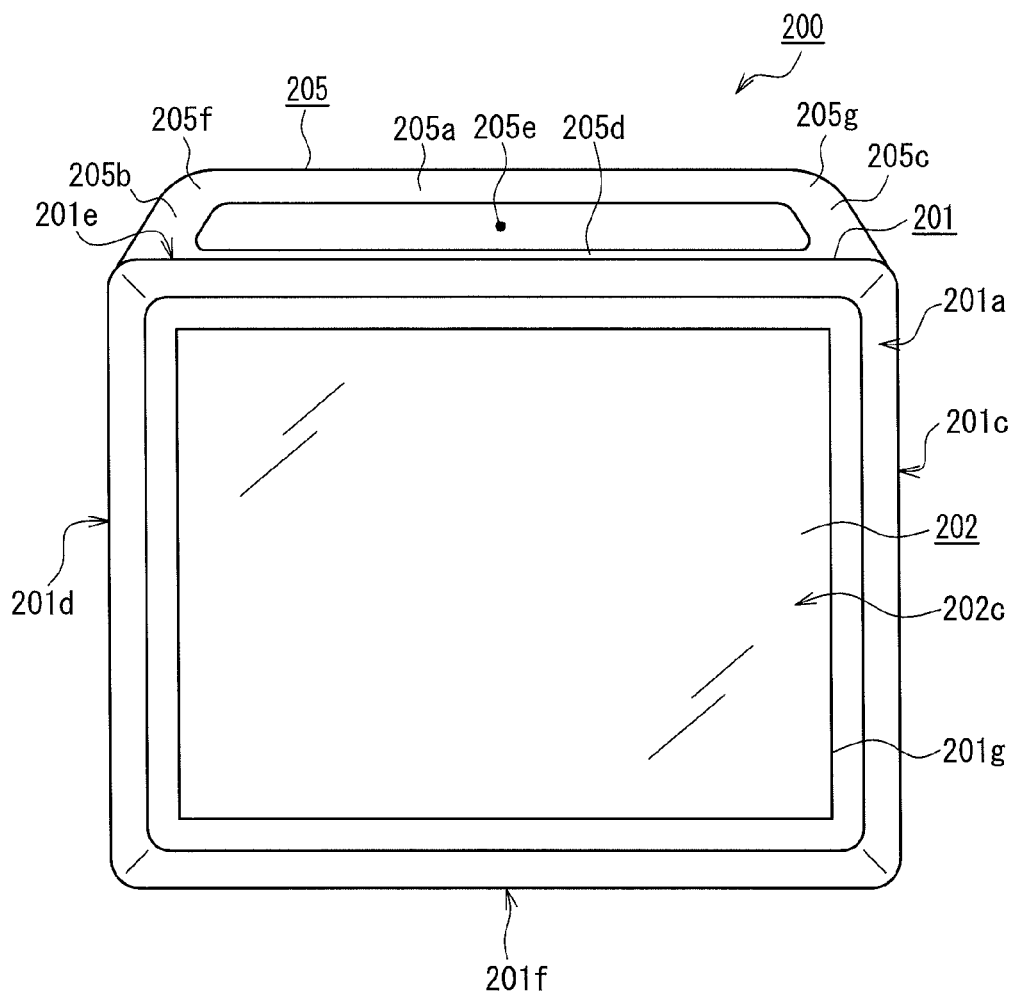
FIG. 13 is a plan view showing Modification Example 2 of an electronic apparatus according to Embodiment 2.

However, as in the plan view showing Modification Example 2 of the electronic apparatus disclosed in the present application presented in FIG. 13, it may be disposed in a place near the boundary between the upper surface 201e and the left side surface 201d or the right side surface 201c on the tablet PC 200 of this embodiment, or may be disposed on the left side surface 201d or on the right side surface 201c.

The tablet PC 200 of Modification Example 2 shown in FIG. 13 includes a handle portion 205 with the respective ends in longitudinal directions being positioned near the end portions in longitudinal directions of the upper surface 201e of the main body part 201. The handle portion 205 includes a grip portion 205a, a first leg portion 205b, a second leg portion 205c, a connecting portion 205d, a through-hole 205e, a first bent portion 205f, and a second bent portion 205g. Although not shown, the handle portion 205 may be tilted toward the back surface 201b side of the main body part 201 as with the handle portion 203 shown in FIG. 8, or may protrude in a plane direction of the back surface 201b as shown in FIG. 12. The second end of the first leg portion 205b is positioned near the boundary with the left side surface 201d on the upper surface 201e. The second end of the second leg portion 205c is positioned near the boundary with the right side surface 201c on the upper surface 201e. By adopting such a configuration, when a user grasps the first bent portion 205f or the second bent portion 205g, for example, when a user grasps the second bent portion 205g with the left hand, user's lower arm is disposed in a place closer to the right side surface 201c than with the tablet PC 200 shown in FIG. 7. Therefore, it is easy to dispose user's lower arm near the center of gravity of the tablet PC 200, i.e., a place extending near the intersection of the diagonal lines of the outer surface 202c of the display device 202, thus enhancing the positional stability of the tablet PC 200. The place of the handle portion 203 shown in FIG. 7 and the place of the handle portion 205 shown in FIG. 13 are examples, and the most suitable place is different according to the size of the main body part 201.

Figure 14:
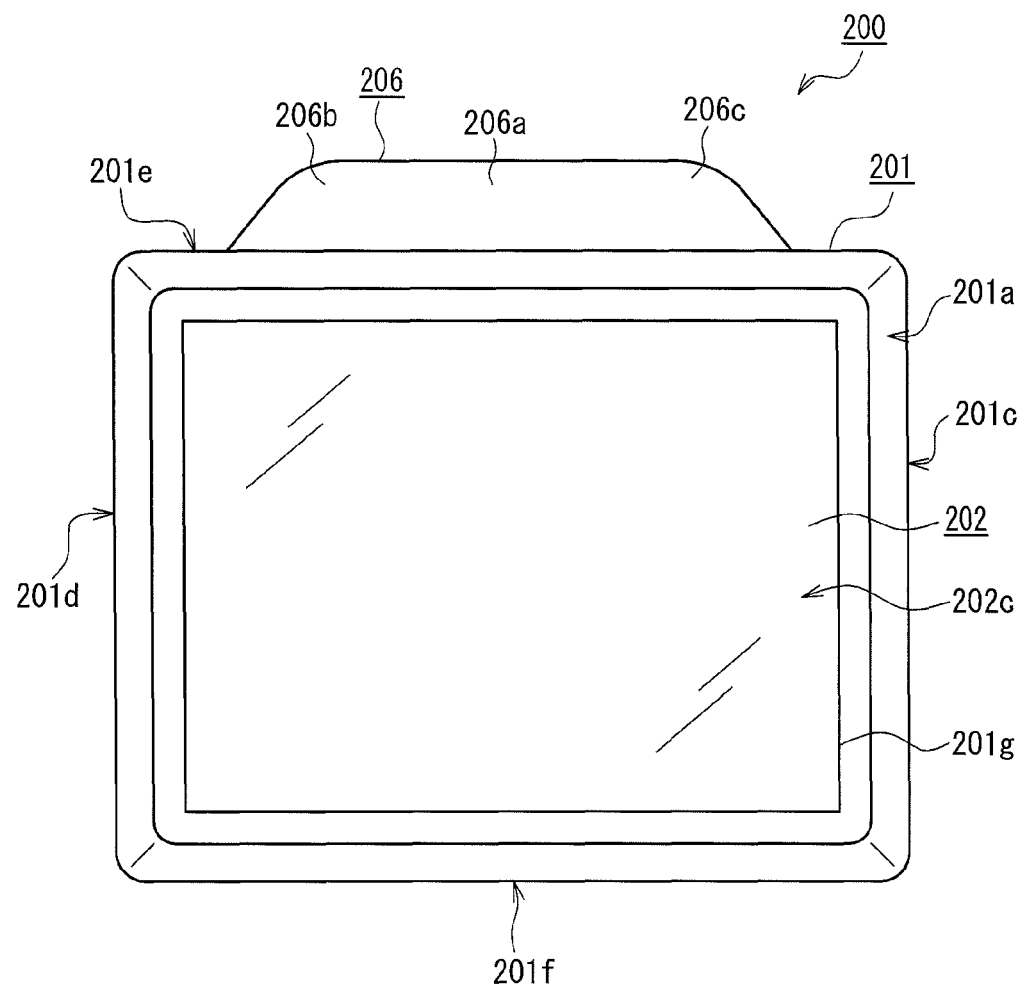
FIG. 14 is a plan view showing Modification Example 3 of an electronic apparatus according to Embodiment 2.

In this embodiment, the handle portion 203 includes the through-hole 203e, but the through-hole 203e is not essential. FIG. 14 is a plan view showing Modification Example 3 of the electronic apparatus disclosed in the present application.

The electronic apparatus 200 of Modification Example 3 shown in FIG. 14 does not have a through-hole in a handle portion 206. The handle portion 206 on the electronic apparatus 200 shown in FIG. 14 is formed in a substantially trapezoidal shape and formed so as to protrude from the upper surface 201a of the main body part 201. The handle portion 206 includes a grip portion 206a, a first bent portion 206b, and a second bent portion 206c. The shapes of the outermost portions of the grip portion 206a, the first bent portion 206b, and the second bent portion 206c may be identical to, for example, the shapes of the outermost portions of the grip portion 203a, the first bent portion 203f, and the second bent portion 203g shown in FIG. 7, respectively. Although not shown, the handle portion 206 may be tilted toward the back surface 201b side of the main body part 201 as with the handle portion 203 shown in FIG. 8, or may project in a plane direction of the back surface 201b as shown in FIG. 12.

When grasping the tablet PC 200 shown in FIG. 14, the second to fifth fingers of the left or right hand are placed along the first bent portion 206b or the second bent portion 206c, and the main body part 201 is placed on the lower arm. Supporting the lower surface 201f of the main body part 201 with the upper arm enables the main body part 201 to be sandwiched between the second to fifth fingers of the left or right hand and the upper arm 232, thus enhancing the positional stability of the tablet PC 200. Although not shown, the through-hole 204e provided in the handle portion 204 shown in FIG. 12 and the through-hole 205e provided in the handle portion 205 shown in FIG. 13 can be omitted.

Figure 15A:
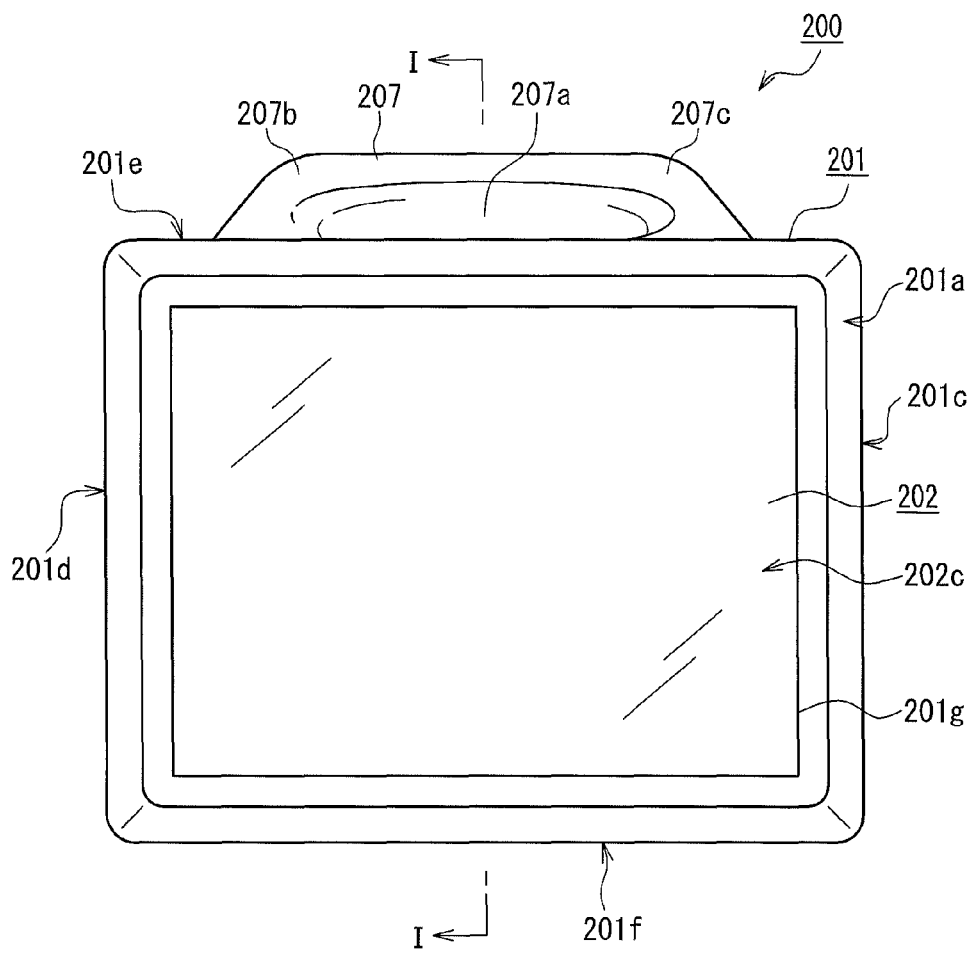
FIGS. 15A and 15B are respectively a plan view and a side view showing an application example of Modification Example 3 of an electronic apparatus according to Embodiment 2.
Figure 15B:
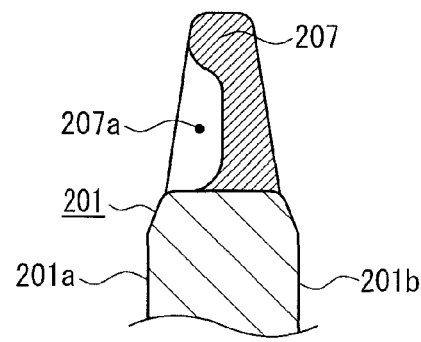

FIGS. 15A and 15B show an application example of the tablet PC 200 of Modification Example 3 shown in FIG. 14.

FIG. 15A shows a plan view of the tablet PC 200 of an application example of Modification Example 3, and FIG. 15B shows its side view. In the case of a handle portion that does not have a through-hole as shown in FIG. 15A, the handle portion may be provided with a recess 207a. As shown in the side view in FIG. 15B, providing the recess 207a on the front 201a side of the main body part 201 allows the fingertips to be placed in the recess 207a when holding bent portions 207b, 207c of a handle portion 207, and thus a user can hold the tablet PC 200 be in a more stable state.

In the example shown in FIG. 15, the recess 207a of the handle portion 207 is provided only on the front surface 201a side of the main body part 201, but it is possible that a recess is also provided on the back surface 201b side of the main body part 201 such that the central portion on both sides of the handle portion 207 is depressed. Accordingly, by grabbing particularly the upper end portion of the handle portion 207, it is possible to hold the tablet PC 200 in a manner similar to grasping for hand carrying Moreover, in this embodiment, the shape of the handle portion 203 is such that the grip portion 203a, the first leg portion 203b, and the second leg portion 203c are formed in a linear shape, and the first bent portion 203f and the second bent portion 203g are formed in a curved shape as shown in FIG. 9, but the first leg portion 203b, the first bent portion 203f, the grip portion 203a, the second bent portion 203g, and the second leg portion 203c may be formed in a continuously curved shape.

In this embodiment, as shown in FIG. 10, because of the configuration in which the tablet PC 200 is grasped with the fingers, it is possible to add a curved shape that fits the palm of the supporting hand or a shape that fits the depressions and projections of the fingers to the shape on the side opposite the through-hole 203e of the first bent portion 203f or the second bent portion 203g.

Also, small depressions and projections may be formed on the surfaces of the first bent portion 203f and the second bent portion 203g. By adopting such a configuration, it is less likely that the first bent portion 203f or the second bent portion 203g slides out of user's hand when grasped with the hand, allowing the tablet PC to be grasped so as to be in a more stable position.

The handle portion 203 of this embodiment includes both the first bent portion 203f and the second bent portion 203g, but may be configured to include only one of such bent portions.

In the description of the foregoing two embodiments, the handle portions 103, 203 have been described as being formed simultaneously and integrally with the cases for the main body parts 101, 201, respectively. However, in both of the foregoing embodiments, a configuration in which the main body parts 101, 201 and the handle portions 103, 203 are produced separately and then combined may be adopted.

Figure 16:
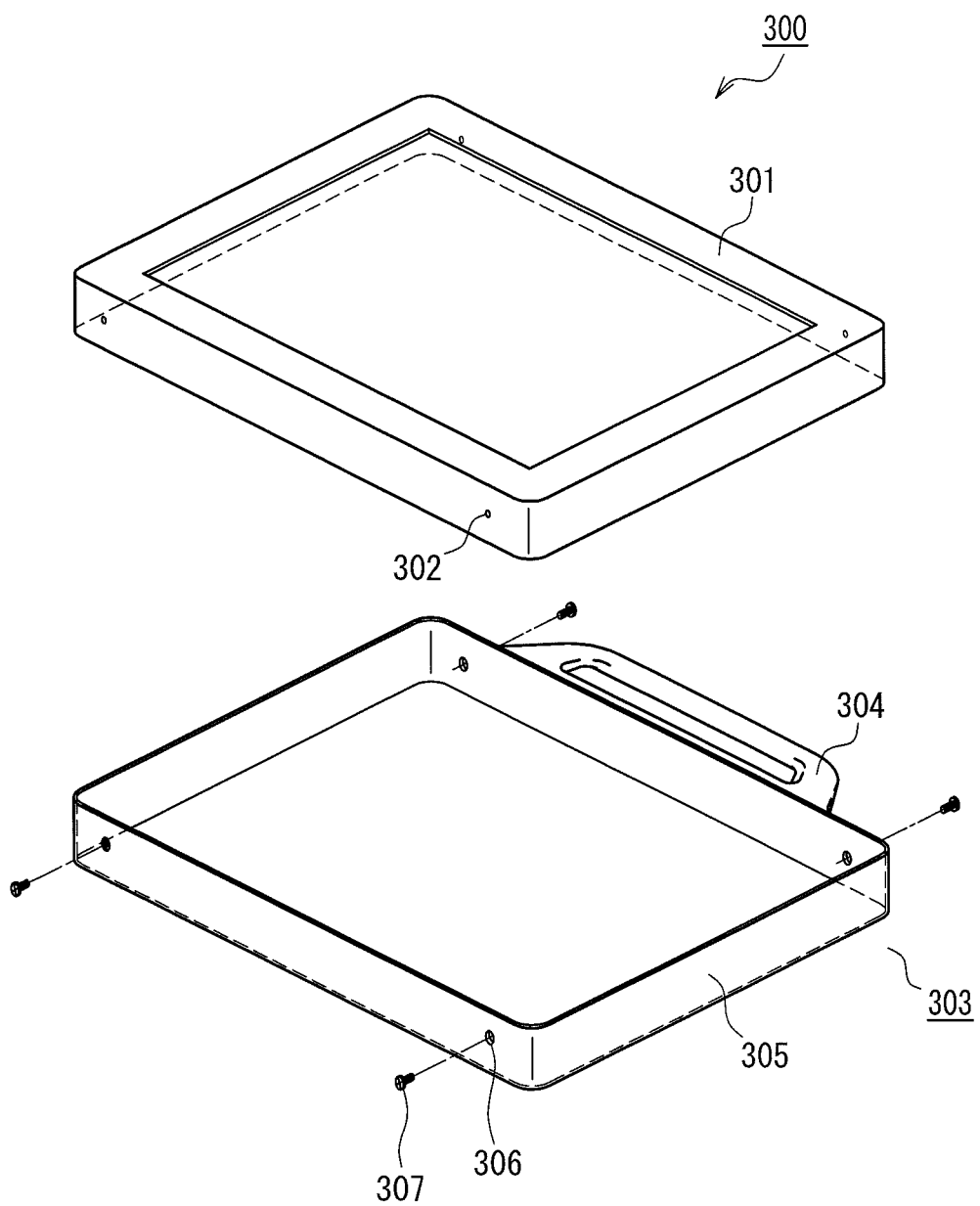
FIG. 16 is an exploded perspective view showing an electronic apparatus provided with the handle portion of Modification Example 1.

FIG. 16 shows a configuration of an electronic apparatus provided with the handle portion of Modification Example 1.

As shown in FIG. 16, in an electronic apparatus 300 provided with a handle portion 303 of Modification Example 1, the handle portion 303 and a tablet PC main body part 301 are formed as separate components. The handle portion 303 of Modification Example 1 has a handle 304 and a hollow frame-shaped member 305 that is fixed to the handle 304 and serves as a main-body supporting portion. The frame-shaped member 305 has a shape capable of circumferentially covering at least a part of the side surface of a main body part 301 in a thickness direction. The handle portion 303 and the tablet PC main body part 301 are screwed together by screws 307 using screw holes 302 formed in the tablet PC main body part 301 and screw holes 306 formed in the frame-shaped member 305. The width of the frame-shaped member 305, i.e., the length in a thickness direction when attached to the side surface of the tablet PC main body part 301 can be suitably selected according to the thickness and the weight of the tablet PC main body part 301 to be attached, the strength resulting from the material of the frame-shaped member 305, the method for attaching the frame-shaped member 305 to the tablet PC main body part 301, and the like.

Figure 17:
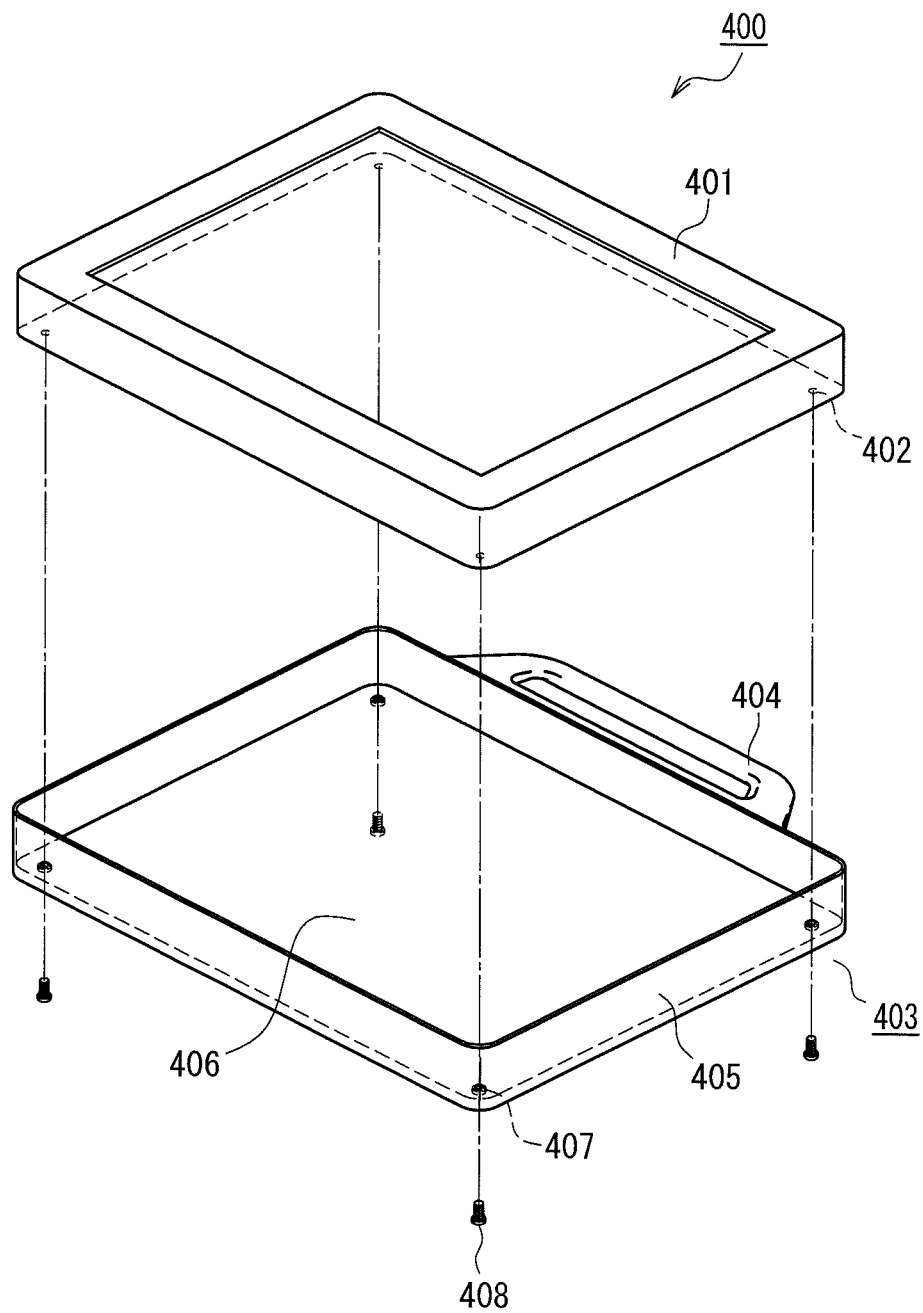
FIG. 17 is an exploded perspective view showing an electronic apparatus provided with the handle portion of Modification Example 2.

FIG. 17 shows a configuration of an electronic apparatus provided with the handle portion of Modification Example 2.

As shown in FIG. 17, in an electronic apparatus 400 provided with a handle portion 403 of Modification Example 2, the handle portion 403 and a tablet PC main body part 401 are formed as separate components. The handle portion 403 of Modification Example 2 includes a handle 404, a frame-shaped member 405 that is fixed to the handle 404 and constitutes a main-body supporting portion, and a bottom surface portion 406 surrounded by the frame-shaped member 405. The frame-shaped member 405 has a shape circumferentially covering at least a part of the side surface of the main body part 401 in a thickness direction, and the tablet PC main body part 401 is disposed so as to be precisely fit inside the space formed by the frame-shaped member 405 and the bottom surface portion 406. The handle portion 403 and the tablet PC main body part 401 are screwed together by screws 408 using screw holes 402 formed in the tablet PC main body part 401 and screw holes 407 formed in the bottom surface portion 406.

Thus, by configuring the handle portion and the tablet PC main body part as separate components, a necessary handle portion can be provided suitably according to how a user uses the tablet PC, in particular, the manner of holding the tablet PC. In addition, it is possible to suitably attach the handle portion described in Embodiment 1 or the handle portion described in Embodiment 2 interchangeably to the tablet PC. For example, providing a handle portion including the handle portion 103 described in Embodiment 1 in which the grip portion is positioned on the back surface side relative to the thickness direction centerline of the main body part as well as a handle portion including a handle having a shape corresponding to that of the handle portion 203 having the bent portions described in Embodiment 2 both for use as the handle 304 of the handle portion 303 described as Modification Example 1 allows changing between two different electronic apparatuses each having a handle that has a shape suitable for the intended use to be obtained while using one main body part.

In FIGS. 16 and 17, examples in which a main body part and a handle portion are screwed together by screws are depicted, but a variety of fixing methods such as adhesion by an adhesive and fixation by claw engagement can be used. In connection with the case where a tablet PC main body part is fitted with a main-body supporting portion as shown in FIG. 17, it is also possible to assume a case where certain strength is secured by mere fitting of a main body part with a supporting portion. The handles 304 and 404 shown in FIGS. 16 and 17, respectively, may also be tilted toward the back surface 101b side as with, for example, the handle 103 described in Embodiment 1 and the handle 203 described in Embodiment 2.

For example, acrylonitrile styrene (AS)-based resin or the like can be used for the handle portions 303, 403 shown in FIGS. 16 and 17, respectively. At this time, materials of the main-body supporting portions 305, 405 are not particularly limited.

Two embodiments and two modification examples have been described above for the electronic apparatus disclosed in the present application. However, the electronic apparatus disclosed in the present application can adopt various configurations other than those described above.

For example, the grip portions 103a, 203a, the first leg portions 103b, 203b, the second leg portions 103c, 203c, and the connecting portions 103d, 203d in the description of the two embodiments, and the handles 304, 404 presented in the two modification examples are described as being integrally produced by resin molding, but a configuration in which individual components are produced separately and then combined may be adopted. Usable combining methods in this case include screw-joining using a screw, adhesion by an adhesive, fixation by claw engagement, and the like.

In the foregoing embodiments, as shown in FIGS. 1 and 6, the planar shapes of the handle portions 103, 203 and the handles 304, 404 are substantially trapezoidal, but their shapes are not limited to being trapezoidal. The planar shapes of the handle portions 103, 203 and the handles 304, 404 may be rectangular, semicircular, or the like. Needless to say, in this case, irrespective of the overall shape of the handle portion 203 of Embodiment 2, the bent portions are respectively formed between the grip portion and the two leg portions.

In the foregoing embodiments, the electronic apparatuses 100, 200, 300, 400 do not include operating members such as buttons and levers, but they may be configured to include operating members such as buttons and levers.

In the foregoing embodiments, a tablet personal computer is described as an example of the electronic apparatus, but the electronic apparatus may be an apparatus provided at least with a handle for transportation and grasping. For example, it is applicable to personal digital assistants (PDAs), portable game machines, portable medical instruments, and the like.

Moreover, providing a display portion with a touch-panel function as described in the foregoing embodiments is not an essential requirement, and it is possible that operation buttons, switches, and the like are disposed on, for example, a so-called frame portion formed around a display panel or on a side surface portion of a main body part so as to control the operation of an electronic apparatus without imparting a function as an input portion to the display panel.

The electronic apparatus disclosed in the present application is useful for an electronic apparatus provided with a handle.

The invention may be embodied in other forms without departing from the spirit or essential characteristics thereof. The embodiments disclosed in the present application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic apparatus comprising:
a main body part provided with a display portion on a front surface side; and
a handle portion having a pair of leg portions with first ends connected to the main body part, and a grip portion connected to second ends of the leg portions, so as to allow the main body part to be held,
the handle portion having a shape such that the grip portion is positioned on a back surface side relative to a main body part thickness direction centerline that is at an equal distance from a front surface and a back surface that is on a side opposite the front surface,
wherein the grip portion of the handle portion is connected to the leg portions via a pair of bent portions with first ends respectively fixed to the second ends of the leg portions and second ends respectively fixed to end portions of the grip portion, and an outer edge of each bent portion is defined by a curve having a specific curvature and a specific length.

2. The electronic apparatus according to claim 1, wherein the outer edge of each bent portion has a curvature that, when user's second to fifth fingers are placed thereon, allows the fingers to be evenly spaced, and a length that allows the user's second to fifth fingers to be placed thereon.

3. An electronic apparatus comprising:
a main body part provided with a display portion on a front surface side; and
a handle portion having a pair of leg portions with first ends connected to the main body part, and a grip portion connected to second ends of the leg portions, so as to allow the main body part to be held,
the handle portion having a shape such that the grip portion is positioned on a back surface side relative to a main body part thickness direction centerline that is at an equal distance from a front surface and a back surface that is on a side opposite the front surface,
wherein the main body part is fixed to a main-body supporting portion including a frame-shaped member that covers at least a part of a side surface, and connected to the leg portions of the handle portion via the main-body supporting portion.

* * * * *